US012782813B2

(12) United States Patent
Lee et al.

(10) Patent No.: US 12,782,813 B2
(45) Date of Patent: Nov. 3, 2026

(54) PHOTOSENSITIVE COMPOSITION COMPRISING INORGANIC PARTICLE

(71) Applicant: DUK SAN NEOLUX CO., LTD., Cheonan-si (KR)

(72) Inventors: Changmin Lee, Cheonan-si (KR); Yun Jong Ko, Cheonan-si (KR); Jun Bae, Cheonan-si (KR); Jun Ki Kim, Cheonan-si (KR); Jin Hyun Kim, Cheonan-si (KR); Younghoon Kang, Cheonan-si (KR); Soung Yun Mun, Cheonan-si (KR)

(73) Assignee: DUK SAN NEOLUX CO., LTD., Cheonan-si (KR)

( * ) Notice: Subject to any disclaimer, the term of this patent is extended or adjusted under 35 U.S.C. 154(b) by 457 days.

(21) Appl. No.: 18/566,809

(22) PCT Filed: Mar. 16, 2022

(86) PCT No.: PCT/KR2022/003646

§ 371 (c)(1),
(2) Date: Dec. 4, 2023

(87) PCT Pub. No.: WO2022/260249

PCT Pub. Date: Dec. 15, 2022

(65) Prior Publication Data

US 2024/0280904 A1 Aug. 22, 2024

(30) Foreign Application Priority Data

Jun. 8, 2021 (KR) ........................ 10-2021-0074332

(51) Int. Cl.
*G03F 7/075* (2006.01)
*H10K 59/38* (2023.01)
*H10K 59/40* (2023.01)

(52) U.S. Cl.
CPC ........... *G03F 7/0755* (2013.01); *H10K 59/38* (2023.02); *H10K 59/40* (2023.02)

(58) Field of Classification Search
CPC ...... G03F 7/0755; G03F 7/0007; G03F 7/031; G03F 7/0388; G03F 7/075; G03F 7/105; G03F 7/0754; H10K 59/38; H10K 59/40
See application file for complete search history.

(56) References Cited

U.S. PATENT DOCUMENTS

2013/0158148 A1* 6/2013 Tsugane ............... C08K 5/0025 522/28
2020/0110337 A1* 4/2020 Tanigaki ............... G03F 7/0007
(Continued)

FOREIGN PATENT DOCUMENTS

JP 2012-92012 A 5/2012
KR 10-2007-0082973 A 8/2007
(Continued)

OTHER PUBLICATIONS

Martim et al., "A urethane-based multimethacrylate mixture and its use in dental composites with combined high- performance properties", Dental Materials, 2014, vol. 30, pp. 155-163.

*Primary Examiner* — Stewart A Fraser
(74) *Attorney, Agent, or Firm* — Vorys, Sater, Seymour and Pease LLP; Mih Suhn Koh

(57) ABSTRACT

Provided are a photosensitive composition prepared with silica particles having a reactive functional group introduced to their surface, thereby having high photosensitivity and implementing a highly reliable curing pattern even in a low-temperature post-baking treatment process, and an organic light emitting display device in which the photosensitive composition is applied.

16 Claims, 1 Drawing Sheet

(56) References Cited

U.S. PATENT DOCUMENTS

2020/0319549 A1* 10/2020 Tanigaki ............... G03F 7/0007
2022/0137266 A1* 5/2022 Ebisu ................... C09D 175/16
359/609

FOREIGN PATENT DOCUMENTS

KR 10-2020-0109102 A 9/2020
WO 2019/078566 A1 4/2019

* cited by examiner

PHOTOSENSITIVE COMPOSITION COMPRISING INORGANIC PARTICLE

TECHNICAL FIELD

The present disclosure relates to a photosensitive composition and a display device manufactured using the same.

BACKGROUND

As a flat panel display device, a liquid crystal display device (LCD), an organic light emitting display device (OLED), etc. are widely used. Among these, the organic light emitting display device has advantages such as low power consumption, a fast response speed, high color reproducibility, high luminance, and a wide viewing angle.

After depositing an organic material layer including a light emitting layer in the organic light emitting display device, an optical patterning process may be performed to form a sealing layer, a color filter, an insulating layer of a touch screen panel, etc. on the organic material layer.

Among the photo-patterning processes, the post-baking treatment process is a process of final curing by applying heat to the pattern formed in the developing process, and a low process temperature is required to prevent the organic layer from being damaged by heat.

Therefore, in the case of photosensitive compositions that form a sealing layer, a color filter, an insulating layer of a touch screen panel, etc., a post-baking treatment process must be performed at a temperature of 100° C. or lower. However, in the case of conventional photosensitive compositions, when a post-baking treatment process is performed at a temperature of 100° C. or lower, there is a problem in that the stability of the patterns obtained after curing is low.

In order to overcome the above problem, it is required that a photosensitive composition enable not only sufficient photocuring in the process of exposing to light during the photo-patterning process, but also thermal curing at low temperatures in the subsequent post-baking treatment process to ensure the stability of the pattern.

SUMMARY

In order to solve the problems of the prior art, an embodiment of the present disclosure is to provide a photosensitive composition manufactured using silica particles having a reactive functional group introduced to their surface, thereby having high photosensitivity and implementing a highly reliable curing pattern even in a low-temperature post-baking treatment process, and an organic light emitting display device in which the photosensitive composition is applied.

The present disclosure provides a photosensitive composition which includes alkali soluble resin; a reactive unsaturated compound; a photoinitiator; a solvent; and a reactive silica particle having a structure represented by the following Formula (1).

Formula (1)

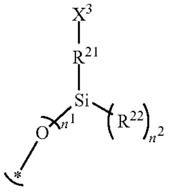

In addition, preferably, the photosensitive composition of the present disclosure further includes a colorant.

Preferably, the alkali soluble resin includes a resin including a repeat unit represented by the following Formula (2):

Formula (2)

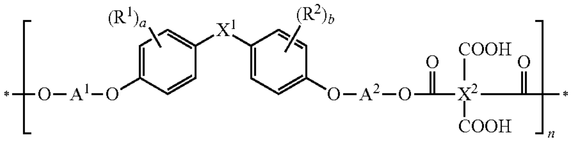

In another embodiment, the present disclosure provides a pattern or film formed from the photosensitive resin composition.

In still another embodiment, the present disclosure provides an organic light emitting display device including the above pattern or film.

In still another embodiment, the present disclosure provides an electronic device including the display device and a control unit that operates the display device.

Advantageous Effects

The present disclosure prepares a photosensitive composition using silica particles having a reactive functional group introduced to their surface, thereby having high photosensitivity and implementing a highly reliable curing pattern even in a low-temperature post-baking treatment process.

Figure 1:
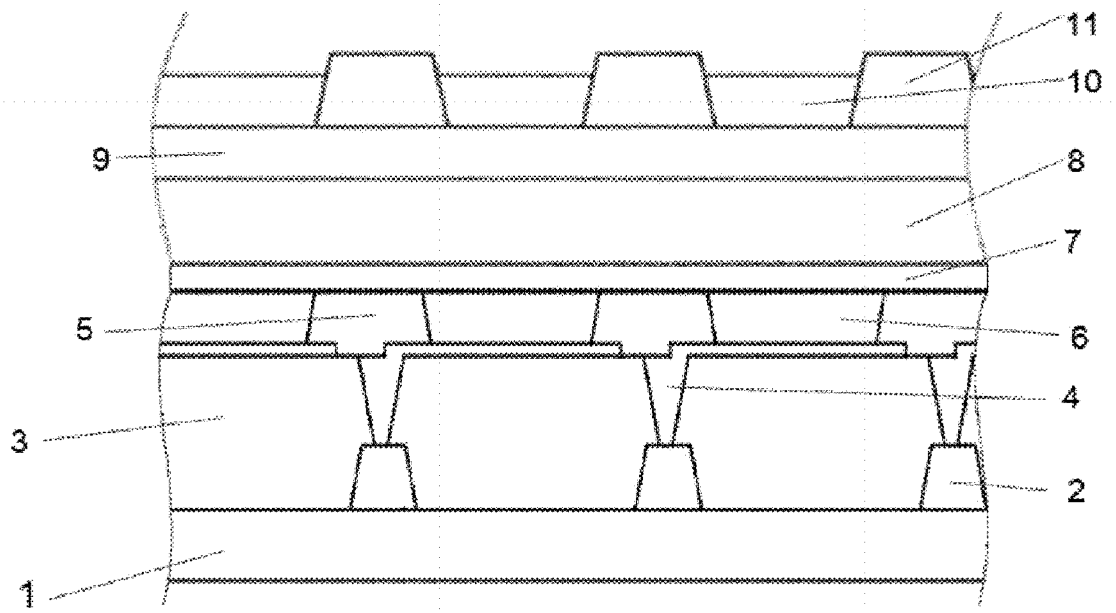
FIG. 1 conceptually shows a display device for implementing the present disclosure.
Figure 2:
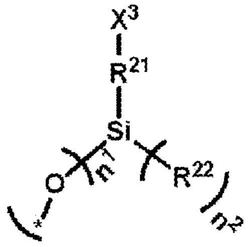
FIG. 2 representatively shows Formula (1) according to the present disclosure.

| | |
|---|---|
| 1: substrate | 2: TFT layer |
| 3: flattening layer | 4: pixel electrode |
| 5: pixel defining layer | 6: organic material layer |
| 7: counter electrode | 8: sealing layer |
| 9: touch panel | 10: color unit |
| 11: color separation unit | |

DETAILED DESCRIPTION

The present disclosure provides a photosensitive composition which includes alkali soluble resin; a reactive unsaturated compound; a photoinitiator; a solvent; and a reactive silica particle having a structure represented by the following Formula (1).

Formula (1)

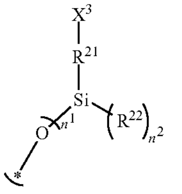

Hereinafter, some embodiments of the present disclosure will be described in detail with reference to exemplary drawings. In adding reference numerals to components of each drawing, the same components may have the same reference numerals even though they are indicated in different drawings.

When it is determined that a detailed description of a related known constitution or function may obscure the gist of the present disclosure in describing the present disclosure, the detailed description thereof may be omitted. When the expressions "includes", "has", "consisting of", etc. mentioned in this specification are used, other parts may be added unless "only" is used. When a component is expressed in the singular form, it may include a case in which the plural form is included unless otherwise explicitly stated.

Additionally, in describing the components of the present disclosure, terms such as first, second, A, B, (a), (b), etc. may be used. These terms are only for distinguishing the components from other components, and the essence, order, sequence, the number, etc. of the components are not limited by the terms.

In the description of the positional relationship of the components, when two or more components are described as being "connected", "linked", or "fused", etc., the two or more components may be directly "connected", "linked", or "fused", but it should be understood that the two or more components may also be "connected", "linked", or "fused" by way of a further "interposition" of a different component. In particular, the different component may be included in any one or more of the two or more components that are to be "connected", "linked", or "fused" to each other.

Additionally, when a component (e.g., a layer, a film, a region, a plate, etc.) is described to be "on top" or "on" of another component, it should be understood that this may also include a case where another component is "immediately on top of" as well as a case where another component is disposed therebetween. In contrast, it should be understood that when a component is described to be "immediately on top of" another component, it should be understood that there is no other component disposed therebetween.

In the description of the temporal flow relationship relating to the components, the operation method, or the preparation method, for example, when the temporal precedence or flow precedence is described by way of "after", "subsequently", "thereafter", "before", etc., it may also include cases where the flow is not continuous unless terms such as "immediately" or "directly" are used.

Meanwhile, when the reference is made to numerical values or corresponding information for components, numerical values or corresponding information may be interpreted as including an error range that may occur due to various factors (e.g., procedural factors, internal or external shocks, noise, etc.) even if it is it not explicitly stated.

The terms used in this specification and the appended claims are as follows, unless otherwise stated, without departing from the spirit of the present disclosure.

As used herein, the term "halo" or "halogen" includes fluorine (F), chlorine (Cl), bromine (Br), and iodine (I), unless otherwise specified.

As used herein, the term "alkyl" or "alkyl group" refers to a radical of a saturated aliphatic functional group, including a linear chain alkyl group, a branched chain alkyl group, a cycloalkyl (alicyclic) group, an alkyl-substituted cycloalkyl group, and a cycloalkyl-substituted alkyl group, which has 1 to 60 carbons linked by a single bond unless otherwise specified.

As used herein, the term "haloalkyl group" or "halogenalkyl group" refers to an alkyl group in which a halogen is substituted, unless otherwise specified.

As used herein, the term "alkenyl" or "alkynyl" has a double bond or triple bond, respectively, includes a linear or branched chain group, and has 2 to 60 carbon atoms unless otherwise specified, but is not limited thereto.

As used herein, the term "cycloalkyl" refers to an alkyl which forms a ring having 3 to 60 carbon atoms unless otherwise specified, but is not limited thereto.

As used herein, the term "alkoxy group" or "alkyloxy group" refers to an alkyl group to which an oxygen radical is linked, and has 1 to 60 carbon atoms unless otherwise specified, but is not limited thereto.

As used herein, the term "alkenoxyl group", "alkenoxy group", "alkenyloxyl group", or "alkenyloxy group" refers to an alkenyl group to which an oxygen radical is linked, and has 2 to 60 carbon atoms unless otherwise specified, but is not limited thereto.

As used herein, the terms "aryl group" and "arylene group" each have 6 to 60 carbon atoms unless otherwise specified, but are not limited thereto. As used herein, the aryl group or arylene group includes a single ring type, a ring assembly, a fused multiple ring compound, etc. For example, the aryl group may include a phenyl group, a monovalent functional group of biphenyl, a monovalent functional group of naphthalene, a fluorenyl group, and a substituted fluorenyl group, and the arylene group may include a fluorenylene group and a substituted fluorenylene group.

As used herein, the term "ring assembly" means that two or more ring systems (monocyclic or fused ring systems) are directly connected to each other through a single bond or double bond, in which the number of direct links between such rings is one less than the total number of ring systems in the compound. In the ring assembly, the same or different ring systems may be directly connected to each other through a single bond or double bond.

As used herein, since the aryl group includes a ring assembly, the aryl group includes biphenyl and terphenyl in which a benzene ring, which is a single aromatic ring, is connected by a single bond. Additionally, since the aryl group also includes a compound in which an aromatic ring system fused to an aromatic single ring is connected by a single bond, it also includes, for example, a compound in which a benzene ring (which is a single aromatic ring) and fluorine (which is a fused aromatic ring system) are linked by a single bond.

As used herein, the term "fused multiple ring system" refers to a fused ring form in which at least two atoms are shared, and it includes a form in which ring systems of two or more hydrocarbons are fused, a form in which at least one heterocyclic system including at least one heteroatom is fused, etc. Such a fused multiple ring system may be an aromatic ring, a heteroaromatic ring, an aliphatic ring, or a combination of these rings. For example, in the case of an aryl group, it may be a naphthalenyl group, a phenanthrenyl group, a fluorenyl group, etc., but is not limited thereto.

As used herein, the term "a spiro compound" has a spiro union, and the spiro union refers to a linkage in which two rings share only one atom. In particular, the atom shared by the two rings is called a "spiro atom", and they are each called "monospiro-", "dispiro-", and "trispiro-" compounds depending on the number of spiro atoms included in a compound.

As used herein, the terms "fluorenyl group", "fluorenylene group", and "fluorenetriyl group" refer to a monovalent, divalent, or trivalent functional group in which R, R', R'', and R''' are all hydrogen in the following structures, respectively, unless otherwise specified; "substituted fluorenyl group", "substituted fluorenylene group", or "substituted fluorenetriyl group" means that at least one of the substituents R, R', R'', and R''' is a substituent other than hydrogen, and includes cases where R and R' are bound to each other to form a spiro compound together with the carbon to which they are linked. As used herein, all of the fluorenyl group, the fluorenylene group, and the fluorenetriyl group may also be referred to as a fluorene group regardless of valences such as monovalent, divalent, trivalent, etc.

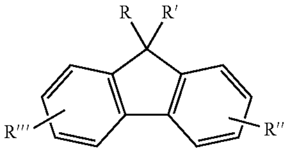

Additionally, the R, R', R'', and R''' may each independently be an alkyl group having 1 to 20 carbon atoms, an alkenyl group having 1 to 20 carbon atoms, an aryl group having 6 to 30 carbon atoms, and a heterocyclic group having 2 to 30 carbon atoms and, for example, the aryl group may be phenyl, biphenyl, naphthalene, anthracene, or phenanthrene, and the heterocyclic group may be pyrrole, furan, thiophene, pyrazole, imidazole, triazole, pyridine, pyrimidine, pyridazine, pyrazine, triazine, indole, benzofuran, quinazoline, or quinoxaline. For example, the substituted fluorenyl group and the fluorenylene group may each be a monovalent functional group or divalent functional group of 9,9-dimethylfluorene, 9,9-diphenylfluorene, and 9,9'-spirobi[9H-fluorene].

As used herein, the term "heterocyclic group" includes not only aromatic rings (e.g., "heteroaryl group" and "heteroarylene group"), but also non-aromatic rings, and may refer to a ring having 2 to 60 carbon atoms each including one or more heteroatoms unless otherwise specified, but is not limited thereto. As used herein, the term "heteroatom" refers to N, O, S, P, or Si unless otherwise specified, and a heterocyclic group refers to a monocyclic group including a heteroatom, a ring assembly, a fused multiple ring system, a spiro compound, etc.

For example, the "heterocyclic group" may include a compound including a heteroatom group (e.g., $SO_2$, P=O, etc.), such as the compound shown below, instead of carbon that forms a ring.

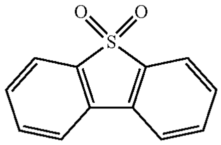 [SMILES: O=S1(=O)c2ccccc2-c2ccccc21]

As used herein, the term "ring" includes monocyclic and polycyclic rings, and includes heterocycles containing at least one heteroatom as well as hydrocarbon rings, and includes aromatic and non-aromatic rings.

As used herein, the term "polycyclic" includes ring assemblies (e.g., biphenyl, terphenyl, etc.), fused multiple ring systems, and spiro compounds, includes non-aromatic as well as aromatic compounds, and includes heterocycles containing at least one heteroatom as well as hydrocarbon rings.

As used herein, the term "alicyclic group" refers to cyclic hydrocarbons other than aromatic hydrocarbons, and it includes monocyclic, ring assemblies, fused multiple ring systems, spiro compounds, etc., and refers to a ring having 3 to 60 carbon atoms unless otherwise specified, but is not limited thereto. For example, when benzene (i.e., an aromatic ring) and cyclohexane (i.e., a non-aromatic ring) are fused, it also corresponds to an aliphatic ring.

Additionally, when prefixes are named consecutively, it means that the substituents are listed in the order they are described. For example, in the case of an arylalkoxy group, it means an alkoxy group substituted with an aryl group; in the case of an alkoxycarbonyl group, it means a carbonyl group substituted with an alkoxy group; additionally, in the case of an arylcarbonyl alkenyl group, it means an alkenyl group substituted with an arylcarbonyl group, in which the arylcarbonyl group is a carbonyl group substituted with an aryl group.

Additionally, unless otherwise specified, the term "substituted" in the expression "substituted or unsubstituted" as used herein refers to a substitution with one or more substituents selected from the group consisting of deuterium, a halogen, an amino group, a nitrile group, a nitro group, a $C_{1-30}$ alkyl group, a $C_{1-30}$ alkoxy group, a $C_{1-30}$ alkylamine group, a $C_{1-30}$ alkylthiophene group, a $C_{6-30}$ arylthiophene group, a $C_{2-30}$ alkenyl group, a $C_{2-30}$ alkynyl group, a $C_{3-30}$ cycloalkyl group, a $C_{6-30}$ aryl group, a $C_{6-30}$ aryl group substituted with deuterium, a $C_{8-30}$ arylalkenyl group, a silane group, a boron group, a germanium group, and a $C_{2-20}$ heterocyclic group containing one or more heteroatoms selected from the group consisting of O, N, S, Si, and P, but is not limited to these substituents.

As used herein, the "names of functional groups" corresponding to the aryl group, arylene group, heterocyclic group, etc. exemplified as examples of each symbol and a substituent thereof may be described as "a name of the functional group reflecting its valence", and may also be described as the "name of its parent compound". For example, in the case of "phenanthrene", which is a type of an aryl group, the names of the groups may be described such that the monovalent group is described as "phenanthryl (group)", and the divalent group is described as "phenanthrylene (group)", etc., but may also be described as "phenanthrene", which is the name of its parent compound, regardless of its valence.

Similarly, in the case of pyrimidine as well, it may be described regardless of its valence, or in the case of being monovalent, it may be described as pyrimidinyl (group); and in the case of being divalent, it may be described as the "name of the group" of the valence (e.g., pyrimidinylene (group)). Therefore, as used herein, when the type of a substituent is described as the name of its parent compound, it may refer to an n-valent "group" formed by detachment of a hydrogen atom linked to a carbon atom and/or hetero atom of its parent compound.

Additionally, in describing the names of the compounds or the substituents in the present specification, the numbers, letters, etc. indicating positions may be omitted. For example, pyrido[4,3-d]pyrimidine may be described as pyridopyrimidine; benzofuro[2,3-d]pyrimidine as benzofuropyrimidine; 9,9-dimethyl-9H-fluorene as dimethylfluorene, etc. Therefore, both benzo[g]quinoxaline and benzo[f]quinoxaline may be described as benzoquinoxaline.

Additionally, unless there is an explicit description, the formulas used in the present disclosure are applied in the same manner as in the definition of substituents by the exponent definition of the formula below.

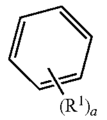

In particular, when a is an integer of 0, it means that the substituent $R^1$ is absent, that is, when a is 0, it means that hydrogens are linked to all carbons that form a benzene ring, and in this case, the formula or compound may be described while omitting the indication of the hydrogen linked to the carbon. Additionally, when a is an integer of 1, one substituent $R^1$ may be linked to any one of the carbons forming a benzene ring; when a is an integer of 2 or 3, it may be linked, for example, as shown below; even when a is an integer of 4 to 6, it may be linked to the carbon of a benzene ring in a similar manner; and when a is an integer of 2 or greater, $R^1$ may be the same as or different from each other.

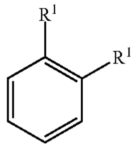

(a = 2)

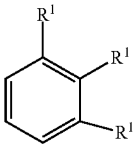

(a = 3)

Unless otherwise specified in the present application, forming a ring means that neighboring groups bind to one another to form a single ring or fused multiple ring, and the single ring and the formed fused multiple ring include a heterocycle containing at least one heteroatom as well as a hydrocarbon ring, and may include aromatic and non-aromatic rings.

Additionally, unless otherwise specified in the present specification, when indicating a condensed ring, the number in "number-condensed ring" indicates the number of rings to be condensed. For example, a form in which three rings are condensed with one another (e.g., anthracene, phenanthrene, benzoquinazoline, etc.) may be expressed as a 3-condensed ring.

Meanwhile, as used herein, the term "bridged bicyclic compound" refers to a compound in which two rings share 3 or more atoms to form a ring, unless otherwise specified. In particular, the shared atoms may include carbon or a hetero atom.

In the present disclosure, an organic electric device may refer to a component(s) between a positive electrode and a negative electrode, or may refer to an organic light emitting diode which includes a positive electrode, a negative electrode, and a component(s) disposed therebetween.

Additionally, in some cases, the display device in the present disclosure may refer to an organic electric device, an organic light emitting diode, and a panel including the same, or may refer to an electronic device including a panel and a circuit. In particular, for example, the electronic device may include a lighting device, a solar cell, a portable or mobile terminal (e.g., a smart phone, a tablet, a PDA, an electronic dictionary, a PMP, etc.), a navigation terminal, a game machine, various TV sets, various computer monitors, etc., but is not limited thereto, and may be any type of device as long as it includes the component(s).

Hereinafter, embodiments of the present disclosure will be described in detail. However, these embodiments are provided for illustrative purposes, and the present disclosure is not limited thereby, and the present disclosure is only defined by the scope of the claims to be described later.

The photosensitive resin composition according to an embodiment of the present disclosure includes alkali soluble resin, a reactive unsaturated compound, a photoinitiator, and a solvent, and may further include a colorant in addition to the above components.

Each component will be described in detail below.

(1) Alkali Soluble Resin

The photosensitive resin composition according to an embodiment of the present disclosure includes a resin which includes a repeat unit represented by the following Formula (2).

Formula (2)

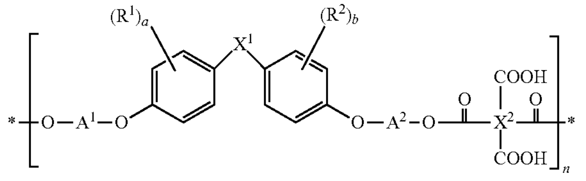

In Formula (2) above,

1) * represents a part where the bindings are connected as a repeat unit, 2) n is an integer of 2 to 200,000, 3) $R^1$ and $R^2$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 4) $R^1$ and $R^2$ are each able to form a ring with neighboring groups, 5) a and b are each independently an integer of 0 to 4, 6) $X^1$ is a single bond; O; CO; $SO_2$; CR'R"; SiR'R"; Formula (A) below; or Formula (B) below, 6-1) R' and R" are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 6-2) R' and R" are each able to form a ring with neighboring groups, Formula (A)

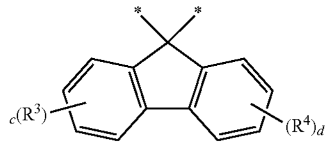

Formula (B)

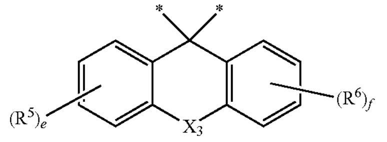

in Formula (A) and Formula (B) above, 6-3) * represents a binding position, 6-4) $X^3$ is O, S, $SO_2$, or NR', 6-5) R' is hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 6-6) $R^3$ to $R^6$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 6-7) $R^3$ to $R^6$ are each able to form a ring with neighboring groups, 6-7) c to f are each independently an integer of 0 to 4, 7) $X^2$ is a fluorenyl group; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; or a combination thereof, 8) $A^1$ and $A^2$ are each independently Formula (C) and Formula (D) below:

Formula (C)

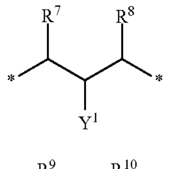

Formula (D)

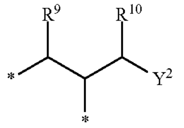

in Formula (C) and Formula (D) above, 8-1) * represents a binding position, 8-2) $R^7$ to $R^{10}$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 8-3) $Y^1$ and $Y^2$ are each independently Formula (E) or Formula (F) below:

Formula (E)

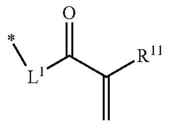

Formula (F)

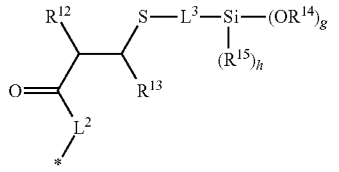

8-3-1) * represents a binding position, 8-3-2) $R^{11}$ to $R^{15}$ are each independently hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 8-3-3) $L^1$ to $L^3$ are each independently a single bond, a fluorenylene group; $C_{1-30}$ alkylene; $C_{6-30}$ arylene; a $C_{2-30}$ heterocyclic ring; or $C_{1-30}$ alkoxylene, 8-3-4) g and h are each independently an integer of 0 to 3, with the proviso that g+h=3, 9) the ratio of Formula (C) or Formula (D) in the resin including a repeating unit represented by Formula (2) above is 1:9 to 9:1, 10) the rings formed by binding between $R^1$ to $R^{15}$, R', R", $X^2$, and $L^1$ to $L^3$ and neighboring groups thereof may each be further substituted with one or more substituents selected from the group consisting of deuterium; a halogen; a silane group substituted or unsubstituted with a $C_{1-30}$ alkyl group or $C_{6-30}$ aryl group; a siloxane group; a boron group; a germanium group; a cyano group; an amino group; a nitro group; a $C_{1-30}$ alkylthio group; a $C_{1-30}$ alkoxy group; a $C_{6-30}$ arylalkoxy group; a $C_{1-30}$ alkyl group; a $C_{2-30}$ alkenyl group; a $C_{2-30}$ alkynyl group; a $C_{6-30}$ aryl group; a $C_{6-30}$ aryl group substituted with deuterium; a fluorenyl group; a $C_{2-30}$ heterocyclic group including at least one heteroatom among O, N, S, Si, and P; a $C_{3-30}$ alicyclic group; a $C_{7-30}$ arylalkyl group; a $C_{8-30}$ arylalkenyl group; and a combination thereof; or may form a ring between the neighboring substituents.

When the $R^1$ to $R^{15}$, R', R", and $X^2$ are an aryl group, preferably, it may be a $C_{6-30}$ aryl group, and more preferably, a $C_{6-18}$ aryl group (e.g., phenyl, biphenyl, naphthyl, terphenyl, etc.).

When the $R^1$ to $R^{15}$, R', R", and $X^2$ are a heterocyclic group, preferably, it may be a $C_{2-30}$ heterocyclic group, and more preferably, a $C_{2-18}$ heterocyclic group (e.g., dibenzofuran, dibenzothiophene, naphthobenzothiophene, naphthobenzofuran, etc.).

When the $R^1$ to $R^{15}$, R', R", and $X^2$ are a fluorenyl group, preferably, it may be 9,9-dimethyl-9H-fluorene, 9,9-diphenyl-9H-fluorenyl group, 9,9'-spirobifluorene, etc.

When the $L^1$ to $L^3$ are an arylene group, preferably, it may be a $C_{6-30}$ arylene group, and more preferably, a $C_{6-18}$ arylene group (e.g., phenyl, biphenyl, naphthyl, terphenyl, etc.).

When the $R^1$ to $R^{15}$, R', R", and $X^2$ are an alkyl group, preferably, it may be a $C_{1-10}$ alkyl group (e.g., methyl, t-butyl, etc.).

When the $R^1$ to $R^{15}$, R', R", and $X^2$ are an alkoxyl group, preferably, it may be a $C_{1-20}$ alkoxyl group, and more preferably, a $C_{1-10}$ alkoxyl group (e.g., methoxy, t-butoxy, etc.).

Rings formed by binding between the neighboring groups of $R^1$ to $R^{15}$, R', R", and $X^2$ and $L^1$ to $L^3$, $L^1$ to $L^3$ may be a $C_{6-30}$ aromatic ring; a fluorenyl group; a $C_{2-60}$ heterocyclic group including at least one heteroatom among O, N, S, Si, and P; and a $C_{3-60}$ aromatic ring, and for example, when neighboring groups bind with each other to form an aromatic ring, preferably, a $C_{6-20}$ aromatic ring, and more preferably a $C_{6-14}$ aromatic ring (e.g., benzene, naphthalene, phenanthrene, etc.) may be formed.

The ratio of Formula (E) to Formula (F) in the polymer chain of the resin containing the repeating unit represented by Formula (2) above is preferably in the ratio of 2:0 to 1:1, and most preferably in the ratio of 1.5:0.5. When the ratio of Formula (F) is higher than that of Formula (E), residues may be generated due to too high adhesion, the amount of outgassing may also increase significantly, whereas when the ratio of Formula (E) to Formula (F) 1.5:0.5, the resolution of the pattern is most excellent and the amount of outgassing is satisfactory.

The weight average molecular weight of the resin including a repeating unit represented by Formula (2) above is 1,000 g/mol to 100,000 g/mol, preferably 1,000 to 50,000 g/mol, more preferably 1,000 g/mol to 30,000 g/mol. When the weight average molecular weight of the resin is within the above range, the pattern formation is well performed without residue during the preparation of a pattern layer, and there is no loss of film thickness during development, and a good pattern can be obtained.

The resin including a repeating unit represented by Formula (2) above may be included in an amount of 1 wt % to 50 wt %, and more preferably 5 wt % to 45 wt %, based on the total amount of the photosensitive resin composition. When the resin is included within the above range, excellent sensitivity, developability and adhesiveness (airtightness) can be obtained.

The photosensitive composition may further include an acryl-based resin in addition to the resin including a repeating unit represented by Formula (2) above. The acryl-based resin is a copolymer of a first ethylenically unsaturated monomer and a second ethylenically unsaturated monomer copolymerizable therewith, and is a resin including one or more acrylic repeating units.

The acryl-based resin may be a copolymer of ethylenically unsaturated monomers including 2 to 10 types of acrylates, methacrylates, styrene, maleimide, maleic acid, maleic anhydride, etc., and may have a weight average molecular weight of 5,000 g/mol to 30,000 g/mol.

The sum of the resin including a repeating unit represented by Formula (2) above and the acryl-based resin may be included in an amount of 1 wt % to 50 wt %, more preferably 5 wt % to 45 wt %, based on the total amount of the photosensitive composition. When the sum of the resin including a repeating unit represented by Formula (2) above and the acryl-based resin is within the above range, excellent sensitivity, developability and adhesiveness (airtightness) can be obtained.

(2) Reactive Unsaturated Compounds

The photosensitive resin composition according to an embodiment of the present disclosure includes a reactive unsaturated compound that can be crosslinked by radicals in the exposure step.

The can form a pattern having excellent heat resistance, light resistance, and chemical resistance by causing sufficient polymerization during exposure to light in the pattern forming process.

Specific examples of the reactive unsaturated compound may be ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, pentaerythritol triacrylate, dipentaerythritol pentaacrylate, dipentaerythritol hexaacrylate, bisphenol A epoxy acrylate, ethylene glycol monomethyl ether acrylate, trimethylolpropane triacrylate, tripentaerythritol octaacrylate, etc.

Examples of commercially available products of the reactive unsaturated compounds are as follows.

Examples of the bifunctional ester of (meth)acrylic acid may include Aronix M-210, M-240, M-6200, etc. (Toa Kosei Kagaku Kogyo Co., Ltd.), KAYARAD HDDA, HX-220, R-604, etc. (Nippon Kayaku Co., Ltd.), and V-260, V-312, V-335 HP, etc. (Osaka Yuki Kagaku Kogyo Co., Ltd.).

Examples of the bifunctional ester of (meth)acrylic acid may include Aronix M-210, M-240, M-6200, etc. (Toa Kosei Kagaku Kogyo Co., Ltd.), KAYARAD HDDA, HX-220, R-604, etc. (Nippon Kayaku Co., Ltd.), and V-260, V-312, V-335 HP, etc. (Osaka Yuki Kagaku Kogyo Co., Ltd.).

These products may be used alone or in combination of two or more.

The reactive unsaturated compound may be used after treating with an acid anhydride so as to provide improved developability. The reactive unsaturated compound may be included in an amount of 1 wt % to 50 wt %, for example, 5 wt % to 30 wt %, based on the total amount of the photosensitive composition. When the reactive unsaturated compound is included within the above range, sufficient curing occurs during exposure to light in the pattern forming process, thus obtaining excellent reliability, excellent heat resistance, light resistance, and chemical resistance of the pattern, and also excellent resolution and adhesion.

(3) Photoinitiator

The photosensitive resin composition according to an embodiment of the present disclosure may include the following photoinitiator, and as the photoinitiators, and an oxime ester-based compound may be used alone or two or more types may be used in combination.

The photoinitiator that can be used in combination with the oxime ester-based compound is a photoinitiator used in a photosensitive resin composition, and for example, an acetophenone-based compound, a benzophenone-based compound, a thioxanthone-based compound, a benzoin-based compound, a triazine-based compound, etc. may be used.

Examples of the oxime ester-based compounds may include 2-(o-benzoyloxime)-1-[4-(phenylthio)phenyl]-1,2-octanedione, 1-(o-acetyloxime)-1-[9-ethyl-6-(2-methyl benzoyl)-9H-carbazol-3-yl]ethanone, O-ethoxycarbonyl-α-oxyamino-1-phenylpropan-1-one, 2-dimethylamino-2-(4-methylbenzyl)-1-(4-morpholin-4-yl-phenyl)-butane-1-one, 1-(4-phenylsulfanylphenyl)-butane-1,2-dione2-oxime-O-benzoate, 1-(4-phenylsulfanylphenyl)-octan-1,2-dione2-oxime-O-benzoate, 1-(4-phenylsulfanylphenyl)-octane-1-oneoxime-O-acetate and 1-(4-phenylsulfanylphenyl)-butan-1-oneoxime-O-acetate, 1-(4-methylsulfanyl-phenyl)-butan-1-oneoxime-O-acetate, hydroxyimino-(4-methylsulfanyl-phenyl)-ethyl acetate-O-acetate, hydroxyimino-(4-methylsulfanyl-phenyl)-ethyl acetate ester-O-benzoate, etc.

Examples of the acetophenone-based compound may include 2,2'-diethoxy acetophenone, 2,2'-dibutoxy acetophenone, 2-hydroxy-2-methylpropiophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, etc.

Examples of the benzophenone-based compound may include benzophenone, benzoyl benzoate, methyl benzoyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxy benzophenone, etc.

Examples of the thioxanthone-based compound may include thioxanthone, 2-chlorthioxanthone, 2-methylthioxanthone, isopropyl thioxanthone, 2,4-diethyl thioxanthone, 2,4-diisopropyl thioxanthone, 2-chlorothioxanthone, etc.

Examples of the benzoin-based compound may include benzoin, benzoin methyl ether, benzoin ethyl ether, benzoin isopropyl ether, benzoin isobutyl ether, benzyldimethyl ketal, etc.

Examples of the triazine-based compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine; 2-biphenyl 4,6-bis(trichloromethyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2-4-trichloromethyl(piperonyl)-6-triazine, 2-4-trichloromethyl(4'-methoxystyryl)-6-triazine, etc.

As the photoinitiator, a carbazole-based compound, a diketone-based compound, a sulfonium borate-based compound, a diazo-based compound, an imidazole-based compound, or a non-imidazole-based compound may be used in addition to the compounds described above.

As the photoinitiator, which is a radical polymerization initiator, a peroxide-based compound, an azobis-based compound, etc. may be used.

Examples of the peroxide-based compound may include ketone peroxides (e.g., methyl ethyl ketone peroxide, methyl isobutyl ketone peroxide, cyclohexanone peroxide, methylcyclohexanone peroxide, acetylacetone peroxide, etc.); diacyl peroxides (e.g., isobutyryl peroxide, 2,4-dichlorobenzoyl peroxide, o-methylbenzoyl peroxide, bis-3,5,5-trimethylhexanoyl peroxide, etc.); hydroperoxides (e.g., 2,4,4-trimethylpentyl-2-hydroperoxide, diisopropylbenzene hydroperoxide, cumene hydroperoxide, t-butyl hydroperoxide, etc.); dialkyl peroxides (e.g., dicumyl peroxide, 2,5-dimethyl-2,5-di(t-butylperoxy)hexane, 1,3-bis(t-butyloxy-isopropyl)benzene, t-butylperoxyvalerate n-butyl ester, etc.); alkyl peresters (e.g., 2,4,4-trimethylpentyl peroxyphenoxyacetate, α-cumyl peroxyneodecanoate, t-butyl peroxybenzoate, di-t-butyl peroxytrimethyl adipate, etc.); percarbonates (e.g., di-3-methoxybutyl peroxydicarbonate, di-2-ethylhexyl peroxydicarbonate, bis-4-t-butylcyclohexyl peroxydicarbonate, diisopropyl peroxydicarbonate, acetylcyclohexylsulfonyl peroxide, t-butyl peroxyaryl carbonate, etc.), etc.

Examples of the azobis-based compound may include 1,1'-azobiscyclohexan-1-carbonitrile, 2,2'-azobis(2,4-dimethylvaleronitrile), 2,2-azobis(methylisobutyrate), 2,2'-azobis(4-methoxy-2,4-dimethylvaleronitrile), α,α'-azobis(isobutylnitrile), 4,4'-azobis(4-cyanovaleric acid), etc.

The photoinitiator may be used together with a photosensitizer that causes a chemical reaction by absorbing light to enter an excited state and then transferring the energy. Examples of the photosensitizer may include tetraethylene glycol bis-3-mercaptopropionate, pentaerythritol tetrakis-3-mercaptopropionate, dipentaerythritol tetrakis-3-mercaptopropionate, etc.

The photoinitiator may be included in an amount of 0.01 wt % to 10 wt %, for example, 0.1 wt % to 5 wt %, based on the total amount of the photosensitive resin composition. When the initiator is included within the above range, it is possible to obtain excellent reliability due to sufficient curing that occurs during exposure to light in the pattern forming process, thereby obtaining excellent heat resistance, light resistance, and chemical resistance of the pattern, and also obtaining excellent resolution and adhesion, and being capable of preventing a decrease in transmittance due to an unreacted initiator.

(4) Colorant

The photosensitive resin composition according to an embodiment of the present disclosure may include colorants, such as various pigments and dyes, independently or together to color the pattern, and both organic pigments and inorganic pigments can be used as the pigment.

As the pigment, a red pigment, a green pigment, a blue pigment, a yellow pigment, a black pigment, etc. can be used.

The pigments may be used alone or in a mixture of two or more, and are not limited to these examples.

Examples of the red pigment may include C.I. Pigment Red 254, C.I. Pigment Red 255, C.I. Pigment Red 264, C.I. Pigment Red 270, C.I. Pigment Red 272, C.I. Pigment Red 177, C.I. Pigment Red 89, etc.

Examples of the green pigment may include halogen-substituted copper phthalocyanine pigments (e.g., C.I. Pigment Green 36, C.I. Pigment Green 7, etc.).

Examples of the blue pigment may include copper phthalocyanine pigments (e.g., C.I. Pigment Blue 15:6, C.I. Pigment Blue 15, C.I. Pigment Blue 15:1, C.I. Pigment Blue 15:2, C.I. Pigment Blue 15:3, C.I. Pigment Blue 15:4, C.I. Pigment Blue 15:5, C.I. Pigment Blue 16, etc.).

Examples of the yellow pigment may include isoindoline-based pigments (e.g., C.I. Pigment Yellow 139, etc.), quinophthalone-based pigments (e.g., C.I. Pigment Yellow 138, etc.), nickel complex pigments (e.g., C.I. Pigment Yellow 150, etc.), etc.

Examples of the black pigment may include, for example, benzofuranone black, lactam black, aniline black, perylene black, titanium black, carbon black, etc.

In order to disperse the pigment in the photosensitive resin composition, a dispersant may be used together. Specifically, the surface of the pigment may be used after treating with a dispersant in advance, or a dispersant may be added together with the pigment during preparation of the photosensitive resin composition.

As the dispersant, a nonionic dispersant, an anionic dispersant, a cationic dispersant, etc. may be used. Specific examples of the dispersant may include polyalkylene glycol and an ester thereof, polyoxyalkylene, a polyhydric alcohol ester alkylene oxide adduct, an alcohol alkylene oxide adduct, a sulfonic acid ester, a sulfonic acid salt, a carboxylic acid ester, a carboxylic acid salt, an alkylamide alkylene oxide adduct, alkyl amine, etc., and these may be used alone or in combination of two or more.

Examples of commercially available products of the dispersant include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, etc., by BYK; EFKA-47, EFKA-47EA, EFKA-48, EFKA-49, EFKA-100, EFKA-400, EFKA-450, etc. by BASF; and Solsperse 5000, Solsperse 12000, Solsperse 13240, Solsperse 13940, Solsperse 17000, Solsperse 20000, Solsperse 24000GR, Solsperse 27000, Solsperse 28000, etc. by Zeneka; or PB711, PB821, etc. by Ajinomoto.

The dispersant may be included in an amount of 0.1 wt % to 15 wt % based on the total amount of the photosensitive resin composition. When the dispersant is included within the above range, the dispersibility of the photosensitive resin composition is excellent, and thus, its stability, developability, and patternability are excellent when preparing the light blocking layer.

The pigment may be used after pretreatment using a water-soluble inorganic salt and a wetting agent. When the pigment is used after pretreatment as described above, the primary particle size of the pigment can be micronized. The pretreatment may be performed through the step of kneading the pigment with a water-soluble inorganic salt and a wetting agent, and the step of filtering and washing the pigment obtained in the kneading step. The kneading may be performed at a temperature of 40° C. to 100° C., and the filtration and washing may be performed by filtration after washing the inorganic salt with water, etc.

Examples of the water-soluble inorganic salt may include sodium chloride, potassium chloride, etc., but are not limited thereto.

The wetting agent serves as a medium through which the pigment and the water-soluble inorganic salt are uniformly mixed and the pigment can easily be pulverized, and examples of the wetting agent may include alkylene glycol monoalkyl ethers (e.g., ethylene glycol monoethyl ether, propylene glycol monomethyl ether, diethylene glycol monomethyl ether, etc.); alcohols (e.g., ethanol, isopropanol, butanol, hexanol, cyclohexanol, ethylene glycol, diethylene glycol, polyethylene glycol, glycerin polyethylene glycol, etc.), etc. and these may be used alone or in combination of two or more.

The pigment that has undergone the kneading step may have an average particle diameter of 20 nm to 100 nm. When the average particle diameter of the pigment is within the above range, it can effectively form fine patterns while having excellent heat resistance and light resistance.

Meanwhile, specific examples of the dye may include, as C.I. Solvent dyes, Yellow dyes (e.g., C.I. Solvent Yellow 4, 14, 15, 16, 21, 23, 24, 38, 56, 62, 63, 68, 79, 82, 93, 94, 98, 99, 151, 162, 163, etc.); Red dyes (e.g., C.I. Solvent Red 8, 45, 49, 89, 111, 122, 125, 130, 132, 146, 179, etc.); Orange Red dyes (e.g., C.I. Solvent Orange 2, 7, 11, 15, 26, 41, 45, 56, 62, etc.); Blue dyes (e.g., C.I. Solvent Blue 5, 35, 36, 37, 44, 59, 67, 70, etc.); Violet dyes (e.g., C.I. Solvent Violet 8, 9, 13, 14, 36, 37, 47, 49, etc.); Green dyes (e.g., C.I. Solvent Green 1, 3, 4, 5, 7, 28, 29, 32, 33, 34, 35, etc.), etc.

Among them, C.I. Solvent Yellow 14, 16, 21, 56, 151, 79, and 93; C.I. Solvent Red 8, 49, 89, 111, 122, 132, 146, and 179; C.I. Solvent Orange 41, 45, and 62; C.I. Solvent Blue 35, 36, 44, 45, and 70; and C.I. Solvent Violet 13 are preferred. In particular, C.I. Solvent Yellow 21 and 79; C.I. Solvent Red 8, 122, and 132; and C.I. Solvent Orange 45 and 62, which have excellent solubility in organic solvents among C.I. Solvent dyes, are more preferred.

Additionally, as C.I. acid dyes, Yellow dyes (e.g., C.I. Acid Yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, 251, etc.); Red dyes (e.g., C.I. Acid Red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422, 426, etc.); Orange dyes (e.g., C.I. Acid Orange 6, 7, 8, 10, 12, 26, 50, 51, 52, 56, 62, 63, 64, 74, 75, 94, 95, 107, 108, 169, 173, etc.); Blue dyes (e.g., C.I. Acid Blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, 340, etc.); Violet dyes (e.g., C.I. Acid Violet 6B, 7, 9, 17, 19, 66, etc.); Green dyes (e.g., C.I. Acid Green 1, 3, 5, 9, 16, 25, 27, 50, 58, 63, 65, 80, 104, 105, 106, 109, etc.), etc. may be included.

Among the Acid dyes, C.I. Acid Yellow 42; C.I. Acid Red 92; C.I. Acid Blue 80 and 90; C.I. Acid Violet 66; and C.I. Acid Green 27, which have excellent solubility in organic solvents among the C.I. Acid dyes, are preferred.

Additionally, as C.I. Direct dyes, Yellow dyes (e.g., C.I. Direct Yellow 2, 33, 34, 35, 38, 39, 43, 47, 50, 54, 58, 68, 69, 70, 71, 86, 93, 94, 95, 98, 102, 108, 109, 129, 136, 138, 141, etc.); Red dyes (e.g., C.I. Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, 250, etc.); Orange dyes (e.g., C.I. Direct Orange 34, 39, 41, 46, 50, 52, 56, 57, 61, 64, 65, 68, 70, 96, 97, 106, 107, etc.); Blue dyes (e.g., C.I. Direct Blue 38, 44, 57, 70, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, 293, etc.); Violet dyes (e.g., C.I. Direct Violet 47, 52, 54, 59, 60, 65, 66, 79, 80, 81, 82, 84, 89, 90, 93, 95, 96, 103, 104, etc.); Green dyes (e.g., C.I. Direct Green 25, 27, 31, 32, 34, 37, 63, 65, 66, 67, 68, 69, 72, 77, 79, 82, etc.), etc. may be included.

Additionally, as C.I. Mordant dyes, Yellow dyes (e.g., C.I. Mordant Yellow 5, 8, 10, 16, 20, 26, 30, 31, 33, 42, 43, 45, 56, 61, 62, 65, etc.); Red dyes (e.g., C.I. Mordant Red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94, 95, etc.); Orange dyes (e.g., C.I. Mordant Orange 3, 4, 5, 8, 12, 13, 14, 20, 21, 23, 24, 28, 29, 32, 34, 35, 36, 37, 42, 43, 47, 48, etc.); Blue dyes (e.g., C.I. Mordant Blue 1, 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, 84, etc.); Violet dyes (e.g., C.I. Mordant Violet 1, 2, 4, 5, 7, 14, 22, 24, 30, 31, 32, 37, 40, 41, 44, 45, 47, 48, 53, 58, etc.); Green dyes (e.g., C.I. Mordant Green 1, 3, 4, 5, 10, 15, 19, 26, 29, 33, 34, 35, 41, 43, 53, etc.), etc. may be included.

In the present disclosure, the pigments or dyes may be used alone or in combination of two or more types.

The pigments and dyes may be included in an amount of 5 wt % to 40 wt %, and more specifically 8 wt % to 30 wt %, based on the total amount of the photosensitive resin composition. When the pigment is included within the above range, the curability and adhesion of the pattern are excellent and colors according to the purpose can be sufficiently expressed.

(5) Reactive Silica Particles

The reactive silica particles are prepared by reacting a silane monomer having a reactive functional group with a typical silica particle and a photosensitive composition.

The reactive silica particles may be prepared by the following method. The method of first synthesizing silica particles with high mechanical strength and then introducing a certain amount of reactive functional groups to the silica surface is a useful method to increase compatibility with other reactive resins while maintaining the advantages of silica particles. There are also a method of reacting a copolymer with a reactive functional group with a siloxane oligomer with a molecular weight of several hundred to several thousand and increasing the particle size to tens to hundreds of nm and a method of preparing particles by mixing reactive functional silane, a reactive organic material, and silane for silica preparation, but these methods have problems in that the density of the silica particles themselves may decrease, which may reduce the mechanical strength, and the reactive functional groups may not be present only on the silica surface, which may decrease the reaction efficiency.

In preparing silica particles into which the reactive functional group is introduced, the silica particles may be prepared by a method in which commercially available products (Dupont's colloidal silica series) are used as silica particles, or as in a conventional method, raw materials of silane (e.g., water glass, alkoxy silane, etc.) may be reacted under the condition of an aqueous solution using a base catalyst. A silane monomer having a reactive group may be added to a solution in which the silica particles are dispersed, and a condensation reaction with the hydroxyl group remaining on the surface of the silica particle may be proceeded, and thereby the surface of the particles may be treated with a reaction group. This is shown in Reaction Scheme 1 below.

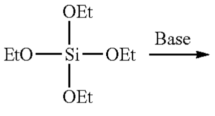

TEOS

-continued

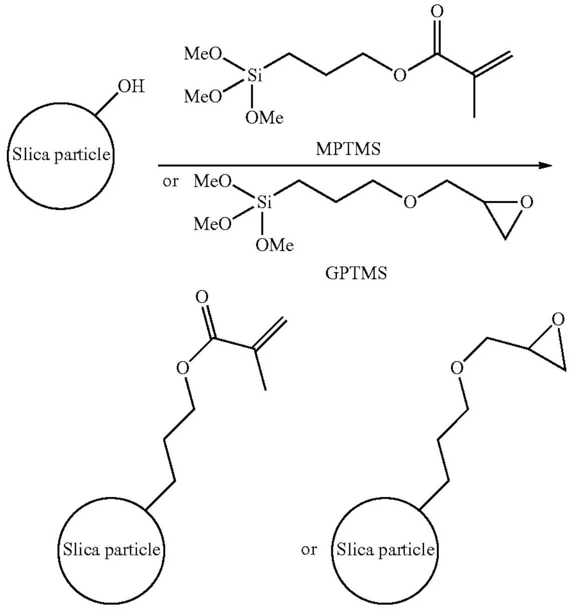

After the condensation reaction, if necessary, a method such as solvent substitution may be used to replace the solvent with another solvent and carry out the reaction.

As the solvent, alcohols (e.g., methanol, ethanol, n-propanol, isopropanol, ethylene glycol, propylene glycol, etc.); ketones (e.g., acetone, methyl ethyl ketone, cyclohexanone, n-methyl-2-pyrrolidone, etc.); aromatic hydrocarbons (e.g., toluene, xylene, tetramethylbenzene, etc.); glycol ethers (e.g., cellosolve, methyl cellosolve, ethyl cellosolve, propylene glycol monomethyl ether, propylene glycol ethyl ether, dipropylene glycol monomethyl ether, dipropylene glycol ethyl ether, etc.); acetates (e.g., ethyl acetate, butyl acetate, methoxybutyl acetate, cellosolve acetate, ethyl cellosolve acetate, butyl cellosolve acetate, propylene glycol monomethyl ether acetate, propylene glycol ethyl ether acetate, etc.) may be used.

When the surface of the particles is treated with a reactor, a catalyst may be further used.

The catalyst is not particularly limited as long as it is an acid catalyst, inorganic acids (e.g., hydrochloric acid, nitric acid, sulfuric acid, phosphoric acid, etc.); organic acids (e.g., monoacids such as formic acid and acetic acid; diacids such as oxalic acid, malonic acid, and succinic acid), etc. may be used.

During the surface treatment reaction of the silica particles, if there are not enough reactive hydroxyl groups on the surface of the silica particles, additional water may be used.

There is no significant limitation on the amount of water used, but it may be used in an amount of 0.1 parts by weight to 1 part by weight based on the weight of the silane monomers subjected to surface treatment reaction.

After completion of the reaction, the remaining water may be removed.

As a method of removing the water, a normal water removal method may be applied, and a method using a reduced pressure distillation (rotary evaporation) or a method using an ultrafiltration membrane may be used.

The silica particles preferably have an average particle diameter of 1 nm to 300 nm, and more preferably 5 nm to 200 nm. When the average particle size is within the above range, the silica particles would have excellent compatibility with a photosensitive composition, and thus not only their developability is improved, but also the transparency of the formed film becomes excellent, and the dispersibility of silica particles is excellent, thus also being economically effective in terms of cost.

It is preferable that the silica particles exist in a stable state under acidic conditions of pH 7 or lower. When the silica particles should be maintained at a condition above pH 7, since they are unstable below pH 7, there is a problem in that they react with acrylic acid in a typical photosensitive composition to form a salt, which reduces the acid value of the photosensitive composition and reduces developability.

The silane monomer is used to treat the surface of silica, and a silane monomer having a photocurable functional group and a silane monomer having a thermosetting functional group may be used.

The silane monomer having the photocurable functional group is not particularly limited as long as it is a silane monomer having an unsaturated functional group, and trimethoxysilylpropyl acrylate, triethoxysilylpropyl acrylate, trimethoxysilylpropyl methacrylate, triethoxysilylpropyl methacrylate, vinyltrimethoxysilane, vinyltriethoxysilane, allyltrimethoxy silane, or allyltriethoxysilane may be used.

The silane monomer having the thermosetting functional group is a monomer having an epoxy isocyanate functional group, glycidyloxypropyltrimethoxysilane, glycidyloxypropyltriethoxysilane, trimethoxysilylpropylisocyanate, triethoxysilylpropylisocyanate, etc. may be used, but are not limited thereto.

The silane monomer may include an epoxy group, (meth) acrylic group, thiol group, isocyanate group, amine group, etc. as a functional group, but is not limited thereto.

The reactive silane monomer is preferably used in an amount of 0.01 mol to 0.2 mol per mole of Si atoms in the silica particles. When the reactive silane monomer is used in the above amount, the functional group is sufficient, and thus its reactivity and developability with the resin are excellent, and has the effect of improving mechanical properties.

The reactive silane monomer may not react during the surface treatment reaction of the silica particles and may exist in a partially unreacted state. When the unreacted silane monomer compound is present in excess, there may be a problem in that deterioration in developability and mechanical properties may occur, and thus it is preferable that the unreacted silane monomer compound be removed using an ultrafiltration membrane.

The reactive silica particles are preferably contained in an amount of 0.1 wt % to 20 wt % based on the total amount of the photosensitive composition. When included in the above amount, the reactive silica particles have the effect of improving photosensitivity of the photosensitive composition, providing excellent developability, and excellent mechanical properties. When the reactive silica particles are included in an amount of less than 0.1 wt % based on the total amount of the photosensitive composition, the effect of sufficiently increasing photosensitivity does not occur, whereas when the reactive silica particles are included in more than 20 wt % based on the total amount of the photosensitive composition, it may be undesirable because too high sensitivity in exposing the photosensitive composition may cause generation of residues or lower resolution.

The reactive silica particles may be included alone in the photosensitive composition and react with the resin in the photosensitive composition during the photopatterning process; additionally, the reactive silica particles may be used as a copolymer by polymerizing with an alkali-soluble resin, which is a reactive resin of the photosensitive composition, before the photopatterning process.

The reactive silica particles may be mixed with a colorant, a dispersant, a resin, and an organic solvent and then added to the photosensitive composition, or may be prepared alone as a dispersion and added to the photosensitive composition.

The reactive silica particles according to an embodiment of the present disclosure preferably include a structure represented by Formula (1) below on the surface.

Formula (1)

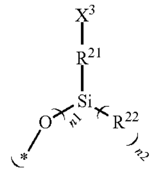

In Formula (1) above,

1) $R^{21}$ is a single bond, a fluorenylene group, $C_{1-30}$ alkylene, $C_{6-30}$ arylene, $C_{2-30}$ heterocycle, or $C_{1-30}$ alkoxylene,
2) $R^{22}$ is a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group,
3) $n^1$ is an integer of 0 to 4; $n^2$ is an integer of 0 to 2; and $n^1+n^2=3$,
4) * is a part being connected to a silica particle,
5) $X^3$ is one of the following Formulas a) to e):

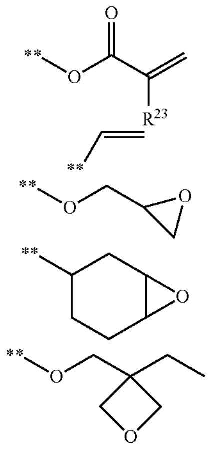

6) ** is a part being connected to Si or $R^{21}$,
7) $R^{23}$ is hydrogen; deuterium; a halogen; a $C_{6-30}$ aryl group; a $C_{2-30}$ heterocyclic group including at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, and 8) the $R^{21}$ to $R^{23}$ and $X^3$ may each be further substituted with one or more substituents selected from the group consisting of deuterium; a halogen; a silane group substituted or unsubstituted with a $C_{1-30}$ alkyl group or $C_{6-30}$ aryl group; a siloxane group; a boron group; a germanium group; a cyano group; an amino group; a nitro group; a $C_{1-30}$ alkylthio group; a $C_{1-30}$ alkoxy group; a $C_{6-30}$ arylalkoxy group; a $C_{1-30}$ alkyl group; a $C_{2-30}$ alkenyl group; a $C_{2-30}$ alkynyl group; a $C_{6-30}$ aryl group; a $C_{6-30}$ aryl group substituted with deuterium; a fluorenyl group; a $C_{2-30}$ heterocyclic group including at least one heteroatom among O, N, S, Si, and P; a $C_{3-30}$ alicyclic group; a $C_{7-30}$ arylalkyl group; a $C_{8-30}$ arylalkenyl group; and a combination thereof; or may form a ring between the neighboring substituents.

When the structure represented by Formula (1) is substituted on the surface of the reactive silica particles, the reactive silica particles would have excellent reactivity and developability with the resin and has the effect of improving mechanical properties.

In addition, the reactive silica particles may scatter light incident into the photosensitive composition during the exposure step of the photopatterning process, thereby further activating the photoinitiator. The photoinitiator further activated by the reactive silica particles increase the degree of resolution and pattern curing, and also reduce the amount of unreacted photoinitiator in the photosensitive composition, thus having the effect of reducing the amount of outgassing caused by the unreacted initiator. In addition, the photoinitiator shows a high curing rate even during thermal curing, thus increasing the reliability of the pattern.

As mentioned above, in the photosensitive resin composition of the present disclosure, it is preferable that reactive silica including the structure represented by Formula (1) on the particle surface and an alkali-soluble resin including a repeating unit of the structure represented by Formula (2) be used, and in particular, it is preferable that the reactive silica, which includes the structure represented by Formula (1) on the surface of the particle, include reactive functional groups represented by Formula (a) to Formula (e).

When the reactive silica including the structure represented by Formula (1) on the particle surface includes a reactive functional group represented by Formula a or Formula b, exposure sensitivity is improved in the photopatterning process (photolithography fixation) that forms a pattern, it provides an effect of improving the degree of curing and it has an advantage in that the stability of the pattern can be secured even if the subsequent post-baking treatment process is performed at a low temperature (100° C. or below) due to sufficient curing during the exposure process.

This effectively activates the photoinitiator by scattering the light incident on the photosensitive composition during the exposure process, and the unsaturated double bond included in the reactive silica effectively forms a bond with the unsaturated double bond of the alkali-soluble resin, which includes the repeating unit represented by the formula (2), and the reactive unsaturated compound.

When the reactive silica including the structure represented by Formula (1) on the surface of the particle includes a reactive functional group represented by Formulas c to e, in the exposure process of the photopatterning process, the reactive functional groups represented by Formulas c to e do not form bonds, and then, in the post-baking treatment process conducted at low temperature (below 100° C.), the reactive functional groups represented by Formula (a) to Formula (e) of the reactive silica react with the carboxylic acid group of the alkali-soluble resin including a repeating unit of the structure represented by Formula (2) to form a crosslink.

Therefore, even if the post-baking treatment process is performed at a low temperature of 100° C. or below, crosslinks are formed between the reactive silica and the alkali-soluble resin, thereby improving the degree of curing of the photosensitive composition and improving the stability of the pattern.

The structure represented by Formula (1) substituted on the surface of the reactive silica particle may include reactive functional groups represented by Formula (a) to Formula (e), and one reactive silica particle may include one or two or more types of reactive functional groups. For example, a structure of Formula (1) including Formula (a) and a structure of Formula (1) including Formula (c) may be simultaneously included on the surface of one reactive silica particle, and depending on the type of the alkali-soluble resin, pigment, reactive unsaturated compound, etc. used in the photosensitive composition, the type of reactive functional group included in the structure of Formula (1) may also be selected in various ways.

(6) Solvent

As the solvent, those materials, which are compatible with the alkali-soluble resin, the reactive unsaturated compound, the pigment, and the initiator but do not react, may be used.

Examples of the solvent include alcohols (e.g., methanol, ethanol, etc.); ethers (e.g., dichloroethyl ether, n-butyl ether, diisoamyl ether, methylphenyl ether, tetrahydrofuran, etc.); glycol ethers (e.g., ethylene glycol monomethyl ether, ethylene glycol monoethyl ether, etc.); cellosolve acetates (e.g., methyl cellosolve acetate, ethyl cellosolve acetate, diethyl cellosolve acetate, etc.); carbitols (e.g., methylethyl carbitol, diethyl carbitol, diethylene glycol monomethyl ether, diethylene glycol monoethyl ether, diethylene glycol dimethyl ether, diethylene glycol methyl ethyl ether, diethylene glycol diethyl ether, etc.); propylene glycol alkyl ether acetates (e.g., propylene glycol methyl ether acetate, propylene glycol propyl ether acetate, etc.); aromatic hydrocarbons (e.g., toluene, xylene, etc.); ketones (e.g., methyl ethyl ketone, cyclohexanone, 4-hydroxy-4-methyl-2-pentanone, methyl-n-propyl ketone, methyl-n-butyl ketone, methyl-n-amyl ketone, 2-heptanone, etc.); saturated aliphatic monocarboxylic acid alkyl esters (e.g., ethyl acetate, n-butyl acetate, isobutyl acetate, etc.); lactic acid esters (e.g., methyl lactate and ethyl lactate); oxyacetic acid alkyl esters (e.g., methyloxyacetate, ethyloxyacetate, butyl oxyacetate, etc.); alkoxy acetate alkyl esters (e.g., methoxy methyl acetate, methoxy ethyl acetate, methoxy butyl acetate, ethoxy methyl acetate, ethoxy ethyl acetate, etc.); 3-oxypropionic acid alkyl esters (e.g., 3-oxy methyl propionate, 3-oxy ethyl propionate, etc.); 3-alkoxy propionic acid alkyl esters (e.g., 3-methoxy methyl propionate, 3-methoxy ethyl propionate, 3-ethoxy ethyl propionate, 3-ethoxy methyl propionate, etc.); 2-oxypropionic acid alkyl esters (e.g., methyl 2-oxypropionate, ethyl 2-oxypropionate, propyl 2-oxypropionate, etc.); 2-alkoxy propionic acid alkyl esters (e.g., 2-methoxy methyl propionate, 2-methoxy ethyl propionate, 2-ethoxy ethyl propionate, 2-ethoxy methyl propionate, etc.); 2-oxy-2-methyl propionic acid esters (e.g., 2-oxy-2-methyl methyl propionate, 2-oxy-2-methyl ethyl propionate, etc.); monooxy monocarboxylic acid alkyl esters of 2-alkoxy-2-methyl propionic acid alkyls (e.g., 2-methoxy-2-methyl methyl propionate, 2-ethoxy-2-methyl ethyl propionate, etc.); esters (e.g., 2-hydroxyethyl propionate, 2-hydroxy-2-methyl ethyl propionate, ethyl hydroxyacetate, 2-hydroxy-3-methyl methyl butanoate, etc.); ketonic acid esters (e.g., ethyl pyruvate, etc.), etc.

Further, high boiling point solvents such as N-methylformamide, N,N-dimethylformamide, N-methylformanilad, N-methylacetamide, N,N-dimethylacetamide, N-methylpyrrolidone, dimethyl sulfoxide, benzylethyl ether, dihexyl ether, acetylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, and phenyl cellosolve acetate may also be used.

Among the solvents above, considering compatibility and reactivity, the following solvents may be used: glycol ethers (e.g., ethylene glycol monoethyl ether, etc.); ethylene glycol alkyl ether acetates (e.g., ethyl cellosolve acetate, etc.); esters (e.g., ethyl 2-hydroxypropionate, etc.); carbitols (e.g., diethylene glycol monomethyl ether, etc.); and propylene glycol alkyl ether acetates (e.g., propylene glycol methyl ether acetate, propylene glycol propyl ether acetate, etc.).

The solvent may be included as a balance based on the total amount of the photosensitive resin composition, and specifically in the amount of 50 wt % to 90 wt %. When the solvent is included within the above range, the photosensitive resin composition has an appropriate viscosity, and thus the processability becomes excellent when preparing the pattern layer.

Another embodiment of the present disclosure may provide an organic light emitting display device.

Hereinafter, an organic light emitting display device will be described referring to FIG. 1. The organic light emitting display device according to an embodiment of the present disclosure is characterized in that it includes a substrate (1), a TFT layer (2) on the substrate, a flattening layer (3) on the TFT layer, an organic light emitting device layer on the flattening layer, a sealing layer (8) disposed on the organic light emitting device layer, a touch panel (9) disposed on a sealing layer, and a color filter disposed on the touch panel, and one or more among the flattening layer, the organic light emitting device layer, the sealing layer, the touch panel, and the color filter include a pattern or film formed of the photosensitive composition of the present disclosure.

The pattern or film is formed of the photosensitive composition, which includes reactive silica particles having a structure represented by Formula (1) on the particle surface and a resin including the repeating unit represented by Formula (2) as essential components.

The substrate (1) may be a flexible substrate. The substrate may be made of a plastic material having excellent heat resistance and durability, such as polyimide (PI), polyethylene terephthalate (PET), polyethylene naphtalate (PEN), polycarbonate (PC), polyarylate (PAR), polyetherimide (PEI), and polyethersulfone (PES). However, the present disclosure is not limited thereto, and various flexible materials (e.g., metal foil or thin glass) may be used. Meanwhile, the substrate may be a rigid a substrate, and in particular, the substrate may be made of a glass material containing $SiO_2$ as a main component.

In the case of a bottom emission type in which the image is implemented in the direction of a substrate, the substrate must be formed of a transparent material. However, in the case of a top emission type in which the image is implemented in the opposite direction of a substrate, the substrate does not necessarily have to be formed of a transparent material. In this case, the substrate may be formed of a metal. When the substrate is formed of a metal, the substrate may include one or more selected from the group consisting of carbon, iron, chromium, manganese, nickel, titanium, molybdenum, and stainless steel (SUS), but is not limited thereto.

ATFT layer (2) may be disposed on the substrate. As used herein, the term TFT layer collectively refers to a thin film transistor (TFT) array for operating an organic light emitting device, and it refers to an operating part for displaying an image. FIG. 1 shows only an organic light emitting device and an operating thin film transistor for operating the organic light emitting device, which are only for convenience of description and the present disclosure is not limited to what is shown, and it is apparent to those skilled in the art that a plurality of thin film transistors, storage capacitors, and various wirings may be further included.

The TFT layer may be covered and protected with a flattening layer (3). The flattening layer may include an inorganic insulating layer and/or an organic insulating layer. Examples of the inorganic insulating film that can be used for the flattening layer may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), barium strontium titanate (BST), lead zirconate-titanate (PZT), etc.

Additionally, examples of the organic insulating film that can be used for the flattening layer may include common general-purpose polymers (PMMA, PS), polymer derivatives having phenol-based groups, acryl-based polymers, imide-based polymers, arylether-based polymers, amide-based polymers, fluorine-based polymers, p-xylene-based polymers, vinyl alcohol-based polymers, blends thereof, etc.

Meanwhile, the flattening layer may have a composite stacked structure of an inorganic insulating film and an organic insulating film. Additionally, the flattening layer may include the photosensitive composition of the present disclosure. Matters regarding the photosensitive composition of the present disclosure are the same as those according to an embodiment of the present disclosure, and will thus be omitted herein. When the flattening layer is formed of the photosensitive composition of the present disclosure, the refractive index of the flattening layer is reduced by the hollow silica particles included in the photosensitive resin composition of the present disclosure, insulating performance can be improved by the reactive silica particles included in the photosensitive composition of the present disclosure, and has the effects of protecting the pixel electrode by forming a high taper angle of 43° or more and easily forming the pixel electrode connected to the TFT.

An organic light emitting device layer may be formed on the upper part of the flattening layer. The organic light emitting device layer may include a pixel electrode (4) formed on the flattening layer, a counter electrode (7) disposed to face the pixel electrode, and an organic material layer (6) interposed therebetween. When a voltage is applied between the pixel electrode and the counter electrode, the organic material layer can emit light. The organic material layer may emit red light, green light, blue light, white light, etc. The organic material layer may emit red light, green light, blue light, white light, etc. The organic light emitting display device may further include blue, green, and red color filters so as to express color images when the organic material layer emits white light, and so as to increase color purity and light efficiency when the organic material layer emits red light, green light, and blue light.

The organic light emitting display device may be classified into a bottom emission type, a top emission type, a dual emission type, etc. according to the emission direction. In an organic light emitting display device of the bottom emission type, the pixel electrode is provided as a light transmitting electrode and the counter electrode is provided as a reflective electrode. In an organic light emitting display device of the top emission type, the pixel electrode is provided as a reflective electrode and the counter electrode is provided as a semi-transmissive electrode. In the present disclosure, the top emission type in which the organic light emitting device emits light in the direction of a sealing layer will be described.

The pixel electrode may be a reflective electrode. The pixel electrode may include a stacked structure of a reflective layer and a transparent or semi-transparent electrode layer having a high work function. The reflective layer may include Ag, Mg, Al, Pt, Pd, Au, Ni, Nd, Ir, Cr, or an alloy thereof. The transparent or semi-transparent electrode layer may include at least one material selected from among transparent conductive oxide materials, such as indium tin oxide (ITO), indium zinc oxide (IZO), zinc oxide (ZnO), indium oxide ($In_2O_3$), indium gallium oxide (IGO), aluminum zinc oxide (AZO), etc. The pixel electrode may be formed by patterning in an island shape corresponding to each pixel. Additionally, the pixel electrode may function as an anode electrode.

Meanwhile, a pixel defining layer (5) may be disposed on the pixel electrode which covers the edge of the pixel electrode and includes a predetermined opening part that exposes the central part of the pixel electrode. An organic material layer including an organic light emitting layer that emits light may be disposed on the area defined by the opening part. The region on which an organic material layer is disposed may be defined as a light emitting region.

Meanwhile, when the light emitting region is formed within the opening part of the pixel defining layer, a region protruding by the pixel defining layer is disposed between the light emitting regions, and this region may be defined as a non-light emitting area because an organic light emitting layer is not formed in this protruding area. The pixel defining layer may include the photosensitive composition of the present invention. Matters regarding the photosensitive composition of the present disclosure are the same as those according to an embodiment of the present disclosure, and will thus be omitted herein.

When the pixel defining layer is formed using the photosensitive composition of the present invention, it has the effects of improving the resolution of the pixel defining layer pattern and reducing outgas generation.

In addition, the photosensitive composition of the present disclosure may include a black pigment or dye, and when a pixel defining film is formed with the photosensitive composition of the present invention including a black pigment or dye, it has the effect of improving the visibility of the organic light emitting display device by absorbing light incident from the outside.

The counter electrode may be formed as a transmissive electrode. The counter electrode may be a semi-transmissive layer in which a metal having a small work function (e.g., Li, Ca, LiF/Ca, LiF/Al, Al, Mg, Ag, etc.) is thinly formed. In order to compensate for the high resistance problem of the thin metal semi-transmissive layer, a transparent conductive layer made of a transparent conductive oxide may be stacked on the metal semi-transmissive layer. The counter electrode may be formed over the entire surface of a substrate in the form of a common electrode. Additionally, such a counter electrode may function as a cathode electrode.

The polarities of the pixel electrode and the counter electrode as described above may be opposite to each other.

The organic material layer includes an organic light emitting layer that emits light, and the organic light emitting layer may use a low-molecular weight organic material or high-molecular weight organic material. When the organic light emitting layer is a low-molecular-weight organic layer formed of a low-molecular organic material, a hole transport layer (HTL), a hole injection layer (HIL), etc. may be disposed in the direction of the pixel electrode around the organic light emitting layer, whereas an electron transport layer (ETL), an electron injection layer (EIL), etc. may be disposed in the direction of a counter electrode. Certainly, other functional layers than the hole injection layer, hole transport layer, electron transport layer, and electron injection layer may be stacked.

A sealing layer (8) may be disposed on the organic light emitting device layer so as to cover the organic light emitting device layer. The organic light emitting device included in the organic light emitting device layer is composed of an organic material and thus can easily be deteriorated by external moisture or oxygen. Therefore, in order to protect the organic light emitting device, the organic light emitting device layer must be sealed. The sealing layer is a means for sealing the organic light emitting device layer, and may have a structure in which a plurality of inorganic layers and a plurality of organic layers are alternately stacked.

As for the organic light emitting display device according to this embodiment, it is preferable to form a sealing layer with a thin film, in which a plurality of inorganic films and a plurality of organic films are alternately stacked instead of a sealing substrate, and flexibility and thinning of the organic light emitting display device can easily be realized by using a thin film as a sealing means.

The sealing layer may include a plurality of inorganic layers and a plurality of organic layers. The inorganic layers and the organic layers may be alternately stacked on each other.

The inorganic layers may be formed of a metal oxide, a metal nitride, a metal carbide, or a combination thereof. For example, the inorganic layers may be made of aluminum oxide, silicon oxide, or silicon nitride. According to another embodiment, the inorganic layers may include a stacked structure of a plurality of inorganic insulating layers. The inorganic layers may perform the function of preventing the penetration of external moisture and/or oxygen, etc. into the organic light emitting device layer.

The order of stacking the inorganic and organic layers constituting the sealing layer is not limited. An organic or inorganic layer may be stacked on the organic light emitting device layer, and the uppermost layer of the sealing layer may also be an organic or inorganic layer.

A touch panel (9) may be formed on the sealing layer. The touch panel may include a first touch electrode formed on the sealing layer, a second touch electrode disposed to face the first touch electrode, and an insulating layer interposed therebetween.

The first touch electrode and the second touch electrode may be formed in a grid pattern or specific pattern shape. The first touch electrode may be formed to be in contact with an upper part of the sealing layer, and an inorganic layer may be additionally provided between the sealing layer and the first touch electrode.

The first touch electrode and the second touch electrode may be formed of ITO (indium tin oxide) or of a metal mesh and may preferably be formed of a metal mesh.

The metal mesh is an electrode prepared by printing an opaque metal (copper, silver, gold, aluminum, etc.) in the form of a grid with a thickness of 1 μm to 7 μm. Due to the use of a metal with high conductivity, the metal mesh has advantages in that it has a low resistance value thus having a fast touch response speed, it enables easy realization of a large screen, and is cheaper than ITO film in cost. In addition, the metal mesh electrode has excellent durability against repeated bending compared to the ITO electrode, thus being suitable for use as a touch panel electrode for a foldable display.

The insulating layer may be formed of the photosensitive composition of the present disclosure. Matters regarding the photosensitive composition of the present disclosure are the same as those according to an embodiment of the present disclosure, and will thus be omitted herein.

When an insulating layer is formed with the photosensitive composition of the present invention, an insulating layer with a very low permittivity is formed by the reactive silica particles included in the photosensitive composition, thus enabling the manufacture of a touch panel with improved response speed and accuracy.

Additionally, in the photosensitive composition of the present disclosure, since the post-baking treatment process is performed at 100° C. or less during the photopatterning process, the insulating layer of the touch panel can be formed without causing thermal damage to the organic material layer of the organic light emitting device layer.

The touch panel is preferably a capacitive type touch panel that detects the position by recognizing the part where the amount of current has changed and calculating the size using the capacitance of the human body when the user touches the touch panel.

It should be apparent to those skilled in the art that the organic light emitting display device of the present disclosure is not limited to those illustrated, and Control IC (which converts the analog signal transmitted from the touch panel into a digital signal and controls the coordinate values, etc. needed to determine the coordinates of the touch area), optical clear adhesive, a flexible printed circuit board (FPCB), in which conductive and signal line patterns are formed to thereby transmit various signals to electronic components, etc.), and other various kinds of electronic components and various kinds of wirings may be further included.

A color filter may be formed on the touch panel. The color filter may be positioned on an upper part of the touch panel, and it may include a color unit (10), which is aligned in a vertical direction with reference to the light emitting area of the organic light emitting device layer; and a color separation unit (11), which is vertically aligned with the non-light-emitting area and separates the color unit.

The photosensitive composition of the present disclosure may be included in the color unit and narrows the wavelength range of light emitted from the light emitting area absorbs and improve color purity of the organic light emitting display device.

Additionally, The photosensitive composition of the present disclosure may be included in the color separation unit and absorbs and blocks external light incident to the organic light emitting display device thereby improving outdoor visibility.

The photosensitive composition of the present disclosure may include a red pigment or red dye and thus form a red colored unit aligned in a vertical direction with reference to the red light emitting area. The photosensitive composition of the present disclosure may include a green pigment or green dye and thus form a red colored unit aligned in a vertical direction with reference to the green light emitting area. The photosensitive composition of the present disclosure may include a blue pigment or blue dye and thus form a red colored unit aligned in a vertical direction with reference to the blue light emitting area. The photosensitive composition of the present disclosure may include a black pigment or black dye and thus form a color separation unit aligned in a vertical direction with reference to the pixel defining film.

When the color part or color separation part of a color filter is formed using the photosensitive composition of the present disclosure, it is possible to have a low amount of outgas generation and form a fine-sized pattern thus capable of manufacturing a color filter with high resolution. Additionally, in the photosensitive composition of the present disclosure, since the post-baking treatment process is performed at 100° C. or less during the photopatterning process, the insulating layer of the touch panel can be formed without causing thermal damage to the organic material layer of the organic light emitting device layer.

The position of each layer in the structure of the organic light emitting display device described above is not limited, and it is apparent to those skilled in the art that multiple functional layers with specific purposes and functions may additionally be placed between each layer, and the organic light emitting display device of the present disclosure is not limited to the structures and drawings described above.

Hereinafter, Synthesis Examples and Examples of the present disclosure will be described in detail; however, these Synthesis Examples and Examples of the present disclosure are not limited thereto.

Synthesis Example 1 (Synthesis of Reactive Silica)

Synthesis Example 1-1

(Synthesis of Reactive Silica 1)

20 g of Ludox® TM40 colloidal silica suspension (particle size: 33 nm/40 wt % in water, Sigma Aldrich) was added along with 180 g of purified water into a 1,000 mL three-neck round bottom flask equipped with a distillation tube and stirred. Upon completion of the dropwise addition, the temperature was raised to 100° C., and the reaction proceeded while stirring for 18 hours. Upon completion of the reaction, the resultant was cooled to room temperature, and the silica, in which Compound (A) was substituted on the surface, was separated using a centrifuge. Thereafter, the resultant was washed with 300 g of purified water to obtain 8.9 g of reactive silica 1 (particle diameter: 54 nm), in which Compound (A) was substituted on the surface.

Compound (A)

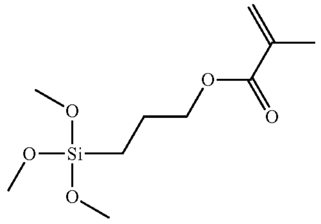

Synthesis Example 1-2

(Synthesis of Reactive Silica 2)

The synthesis was performed in the same manner as in Synthesis Example 1-1, except that 8 g of KBM-503 in Synthesis Example 1-1 was changed to 8 g of KBM-1403 (Compound (B), Shinetsu Co., Ltd.), to obtain 8.8 g of reactive silica 2 (particle diameter: 54 nm), in which Compound (B) was substituted on the surface.

Compound (B)

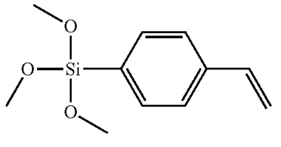

Synthesis Example 1-3

(Synthesis of Reactive Silica 3)

The synthesis was performed in the same manner as in Synthesis Example 1-1, except that 8 g of KBM-503 in Synthesis Example 1-1 was changed to 8 g of KBM-303 (Compound (C), Shinetsu Co., Ltd.), to obtain 8.9 g of reactive silica 3 (particle diameter: 54 nm), in which Compound (C) was substituted on the surface.

Compound (C)

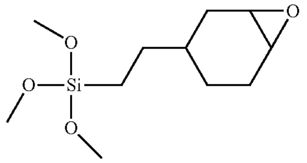

Synthesis Example 1-4

(Synthesis of Reactive Silica 4)

The synthesis was performed in the same manner as in Synthesis Example 1-1, except that 8 g of KBM-503 in Synthesis Example 1-1 was changed to 8 g of KBM-403 (Compound (D), Shinetsu Co., Ltd.), to obtain 8.8 g of reactive silica 4 (particle diameter: 54 nm), in which Compound (D) was substituted on the surface.

Compound (D)

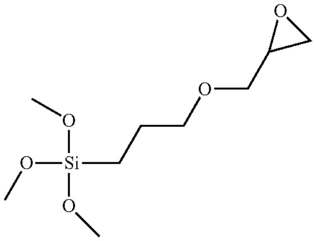

Synthesis Example 1-5

(Synthesis of Reactive Silica 5)

The synthesis was performed in the same manner as in Synthesis Example 1-1, except that 8 g of KBM-503 in Synthesis Example 1-1 was changed to 4 g of KBM-403 and 4 g of KBM-503, to obtain 8.8 g of reactive silica 5 (particle diameter: 54 nm), in which Compound (A) and Compound (D) were substituted on the surface.

Synthesis Example 1-6

(Synthesis of Reactive Silica 6)

The synthesis was performed in the same manner as in Synthesis Example 1-1, except that 80 g of NanoXact silica nanospheres (particle size: 500 nm/10 wt % in water, nanoComposix Inc.) and 100 g of purified water were used instead of Ludox® TM40 colloidal silica suspension, to obtain 8.7 g of reactive silica 6 (particle diameter: 520 nm), in which Compound (A) was substituted on the surface.

Synthesis Example 1-7

(Synthesis of Non-Reactive Silica 1)

The synthesis was performed in the same manner as in Synthesis Example 1-1, except that 8 g of KBM-503 was changed to 8 g of hexyltrimethoxysilane (Compound (E), TCI), to obtain 8.6 g of non-reactive silica 1 (particle diameter: 54 nm), in which Compound (E) was substituted on the surface.

Compound (E)

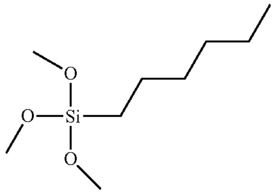

Synthesis Example 2

Synthesis Example 2-1

(Synthesis of Compound 1-1)

80 g (0.228 mol, Sigma Aldrich) of 9,9'-bisphenol fluorene, 42.67 g (0.461 mol, Sigma Aldrich) of glycidyl chloride, and 191 g (1.38 mol) of anhydrous potassium carbonate were added, and dimethylformamide (600 mL) were added into a 1,500 mL three-neck round bottom flask equipped with a distillation tube, the temperature was raised to 80° C. and reacted for 4 hours, and then, the temperature was lowered to 25° C. The reaction solution was filtered, the filtrate was added dropwise to 1,000 mL of water while stirring, and the precipitated powder was filtered, washed with water, and dried under reduced pressure at 40° C., to obtain 100 g (216 mmol) of Compound 1-1.

(Compound 1-1)

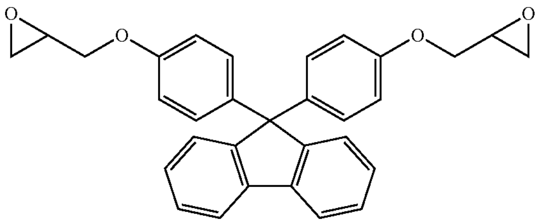

Synthesis Example 2-2

(Synthesis of Monomers 1-1 to 1-3)

25 g (54 mmol) of Compound 1-1 obtained in Synthesis Example 2-1, 7.9 g (0.11 mol) of acrylic acid (Daejung Chemicals & Metals), 0.03 g (0.16 mol) of benzyltriethylammonium chloride (Daejung Chemicals & Metals), 0.01 g (0.05 mol) of hydroquinone (Daejung Chemicals & Metals), and 52 g of toluene (Sigma Aldrich) were added into a 1,500 mL three-neck round bottom flask equipped with a distillation tube, stirred at 110° C. for 6 hours. Upon completion of the reaction, toluene was removed by distillation under reduced pressure to obtain the product. 500 g of silica gel 60 (230-400 mesh, Merck) was filled into a glass column with a diameter of 220 mm, and then filled with 20 g of the product, and was subjected to separation using 10 L of a solvent mixed with hexane and ethyl acetate at a volume ratio of 4:1 to separate Monomers 1-1 to 1-3.

Synthesis Examples 2-3 to 2-9

(Synthesis of Polymers 1-1 to 1-7)

Monomers 1-1 to 1-3 obtained in Synthesis Example 2-2 in a total of 5 g (8.2 mmol) were added into a 50 mL three-neck round bottom flask each equipped with a distillation tube as shown in Table 1 below, and then, 0.005 g of benzyltriethyl ammonium chloride (0.03 mmol, Daejeong Chemical Co., Ltd.), 0.001 g of hydroquinone (0.01 mmol, Daejeong Chemical Co., Ltd.), and 14 g of propylene glycol methyl ether acetate (Sigma Aldrich) were added to the three-neck round bottom flask equipped with a distillation tube, 1.21 g of biphenyltetracarboxylic dianhydride (4 mmol, Mitsubishi Gas) and 0.38 g of tetrahydrophthalic acid (2 mmol, Sigma Aldrich) were added thereto, and the mixture was stirred again at 110° C. for 6 hours. Upon completion of the reaction, the reaction solution was recovered and Polymers 1-1 to 1-7, which are a mixture of repeating units of the structures of Monomer 1-1, 1-2, and 1-3, were obtained in the form of a solution with a solid content of 45%. The molecular weight of the synthesized polymers was analyzed using gel permeation chromatography (Agilent).

(Monomer 1-1)

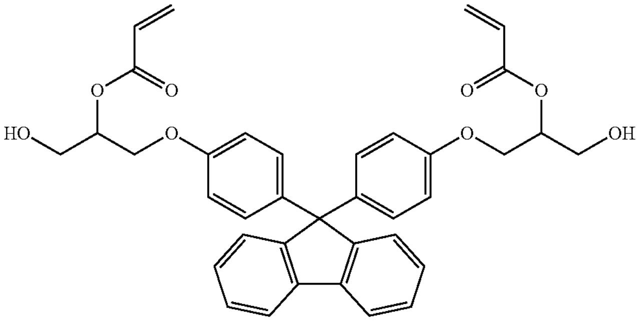

(Monomer 1-2)

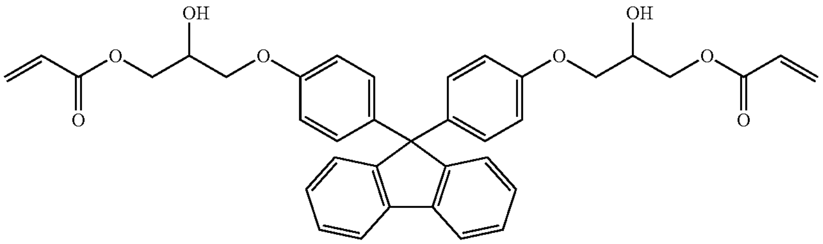

(Monomer 1-3)

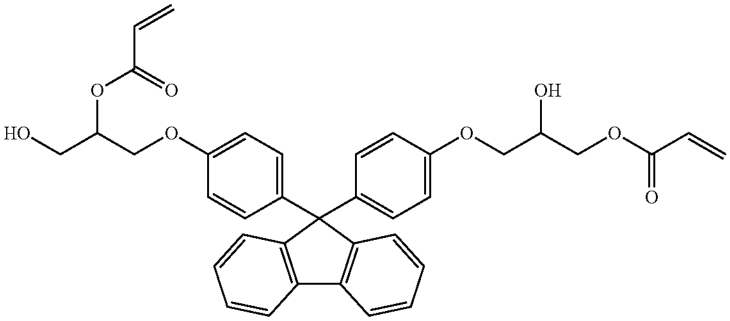

TABLE 1

| | Synthesis Example 2-3 (Polymer 1-1) | Synthesis Example 2-4 (Polymer 1-2) | Synthesis Example 2-5 (Polymer 1-3) | Synthesis Example 2-6 (Polymer 1-4) | Synthesis Example 2-7 (Polymer 1-5) | Synthesis Example 2-8 (Polymer 1-6) | Synthesis Example 2-9 (Polymer 1-7) |
|---|---|---|---|---|---|---|---|
| Monomer 1-1 | 3 g (4.95 mmol) | 1 g (1.65 mmol) | 1 g (1.65 mmol) | 4.25 g (7.01 mmol) | 0.25 g (0.41 mmol) | 5 g (8.24 mmol) | 0 g |
| Monomer 1-2 | 1 g (1.65 mmol) | 3 g (4.95 mmol) | 1 g (1.65 mmol) | 0.25 g (0.41 mmol) | 4.25 g (7.01 mmol) | 0 g | 5 g (8.24 mmol) |
| Monomer 1-3 | 1 g (1.65 mmol) | 1 g (1.65 mmol) | 3 g (4.95 mmol) | 0.5 g (0.83 mmol) | 0.5 g (0.83 mmol) | 0 g | 0 g |
| Weight Average Molecular Weight | 4,800 g/mol | 4,200 g/mol | 4,600 g/mol | 4,400 g/mol | 4,100 g/mol | 5,200 g/mol | 3,300 g/mol |

Synthesis Example 2-10

(Synthesis of Compound 2-1)

In a three-neck round bottom flask equipped with a distillation tube connected to cooling water, 20 g (0.147 mol) of trichloro silane (Gelest) and 17.51 g (0.147 mol) of 6-chloro-1-hexene (Aldrich) were dissolved in 200 mL of ethyl acetate, and then, 0.02 g of a platinum(0)-1,3-divinyl-1,1,3,3-tetramethyldisiloxane complex solution (2 wt % in xylene, Aldrich), nitrogen was added thereto and the temperature was raised to 75° C. and the mixture was reacted for 5 hours, and then, the solution was filtered through a 0.1 μm Teflon membrane to remove the platinum catalyst. Thereafter, 15.6 g (0.487 mol) of methanol was added dropwise at room temperature for 30 minutes. After raising the temperature to 50° C. and reacting for an additional 2 hours, the reaction solution was purified under reduced pressure to remove the solvent. 24 g (0.1 mol) of the thus-obtained chlorohexyltrimethoxysilane and 8 g (0.15 mol) of sodium methoxide (Aldrich), 187 mL (0.15 mol) of a hydrogen sulfide THF solution (0.8 M concentration), and 100 mL of methanol were added into an autoclave, and the reaction was proceeded at 100° C. for 2 hours. After cooling the reaction solution, 100 mL of hydrogen chloride in methanol (1.25 M concentration) was added dropwise at room temperature for 30 minutes, and the resulting salt was removed by filtration, and 23 g of Compound 2-1 was obtained by distillation under reduced pressure.

(Compound 2-1)

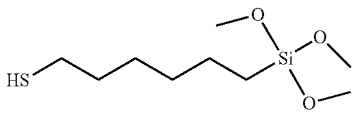

Synthesis Example 2-11

(Synthesis of Compound 2-2)

The synthesis was proceeded in the same manner as in Synthesis Example 2-10, except that 23.7 g (0.147 mol) 9-chloro-1-nonene (AK Scientific) was used instead of 6-chloro-1-hexene.

(Compound 2-2)

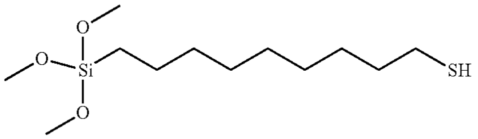

Synthesis Example 2-12

(Synthesis of Compound 2-3)

The synthesis was proceeded in the same manner as in Synthesis Example 2-10, except that 23.7 g (0.147 mol) 9-chloro-1-nonene (AK Scientific) was used instead of 30 g (0.147 mol) of 12-chloro-1-dodecene (Atomax Chemicals).

(Compound 2-3)

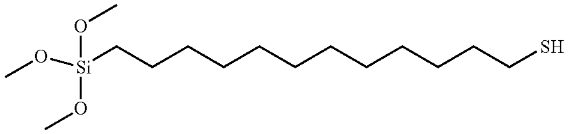

Synthesis Example 2-13

(Synthesis of Compound 2-4)

The synthesis was proceeded in the same manner as in Synthesis Example 2-10, except that 22.4 g (0.487 mol) of ethanol (Aldrich) was used instead of the methanol added after removing platinum.

(Compound 2-4)

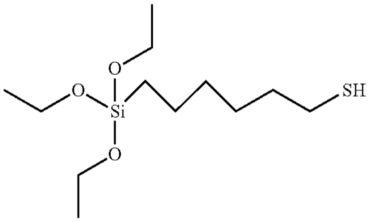

Synthesis Example 2-14

(Synthesis of Compound 2-5)

The synthesis was proceeded in the same manner as in Synthesis Example 2-10, except that 36 g (0.487 mol) of 1-butanol (Aldrich) was used instead of the methanol added after removing platinum.

(Compound 2-5)

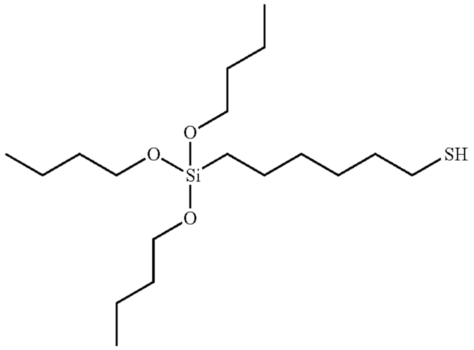

Synthesis Example 2-15

(Synthesis of Compound 2-6)

The synthesis was proceeded in the same manner as in Synthesis Example 2-10, except that 18 g (0.147 mol) of dichloromethylsilane was used instead of trichloro silane.

(Compound 2-6)

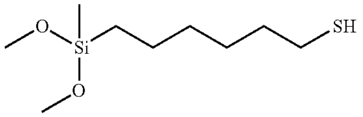

Synthesis Example 2-16

(Synthesis of Binder 1-1)

6.36 g (34 mmol) of KBM 803 (3-(trimethoxysilyl)-1-propanethiol) (Shinetsu), which is the same as Compound 2-7, was added to 360 g of the solution of Polymer 1-1 prepared in Synthesis Example 2-3, and the temperature was raised to 60° C. and stirred for 4 hours, and thereby Binder 1-1, which is a cardo-based binder resin in which a silane group as Compound 2-7 is substituted, was obtained.

(Compound 2-7)

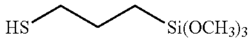

Synthesis Examples 2-17 to 2-22

(Synthesis of Binder 1-7)

Cardo-based binder resins, Binders 1-2 to 1-7, in which the silane group is substituted, were prepared in the same manner as in Synthesis Example 2-16, except that Polymers 1-2 to 1-7 shown in Table 2 below were used instead of the solution of Polymer 1-1 in Synthesis Example 2-16.

TABLE 2

| | Synthesis Example 2-16 (Binder 1-1) | Synthesis Example 2-17 (Binder 1-2) | Synthesis Example 2-18 (Binder 1-3) | Synthesis Example 2-19 (Binder 1-4) | Synthesis Example 2-20 (Binder 1-5) | Synthesis Example 2-21 (Binder 1-6) | Synthesis Example 2-22 (Binder 1-7) |
|---|---|---|---|---|---|---|---|
| Polymer Backbone | Polymer 1-1 | Polymer 1-2 | Polymer 1-3 | Polymer 1-4 | Polymer 1-5 | Polymer 1-6 | Polymer 1-7 |
| Silane Group | Compound 2-7 | Compound 2-7 | Compound 2-7 | Compound 2-7 | Compound 2-7 | Compound 2-7 | Compound 2-7 |
| Solid Content | 34% | 34% | 34% | 34% | 34% | 34% | 34% |
| Weight Average Molecular Weight | 4,880 g/mol | 4,250 g/mol | 4,680 g/mol | 4,430 g/mol | 4,140 g/mol | 5,270 g/mol | 3,320 g/mol |

Synthesis Example 2-23

(Synthesis of Binder 2-1)

8.1 g (34 mmol) of 6-(trimethoxysilyl)-1-hexanethiol (Compound 2-1) was added to 360 g of the solution of Polymer 1-1 prepared in Synthesis Example 2-3, and the temperature was raised to 60° C. and stirred for 4 hours, and thereby Binder 2-1, which is a cardo-based binder resin in which a silane group as in Compound 2-1 is substituted, was obtained.

Synthesis Examples 2-24 to 2-29

(Synthesis of Binder 2-7)

Cardo-based binder resins, Binders 2-2 to 2-7, in which the silane group is substituted, were prepared in the same manner as in Synthesis Example 2-23, except that Polymers 1-2 to 1-7 shown in Table 3 below were used instead of the solution of Polymer 1-1 in Synthesis Example 2-23.

TABLE 3

| | Synthesis Example 2-23 (Binder 2-1) | Synthesis Example 2-24 (Binder 2-2) | Synthesis Example 2-25 (Binder 2-3) | Synthesis Example 2-26 (Binder 2-4) | Synthesis Example 2-27 (Binder 2-5) | Synthesis Example 2-28 (Binder 2-6) | Synthesis Example 2-29 (Binder 2-7) |
|---|---|---|---|---|---|---|---|
| Polymer Backbone | Polymer 1-1 | Polymer 1-2 | Polymer 1-3 | Polymer 1-4 | Polymer 1-5 | Polymer 1-6 | Polymer 1-7 |
| Silane Group | Compound 2-1 | Compound 2-1 | Compound 2-1 | Compound 2-1 | Compound 2-1 | Compound 2-1 | Compound 2-1 |
| Solid Content | 34% | 34% | 34% | 34% | 34% | 34% | 34% |
| Weight Average Molecular Weight | 4,900 g/mol | 4,280 g/mol | 4,690 g/mol | 4,470 g/mol | 4,160 g/mol | 5,290 g/mol | 3,360 g/mol |

Synthesis Example 2-30

(Synthesis of Binder 3-1)

9.530 g (34 mmol) of 6-(triethoxysilyl)-1-hexanethiol (Compound 2-4) was added to 360 g of the solution of Polymer 1-1 prepared in Synthesis Example 2-3, and the temperature was raised to 60° C. and stirred for 4 hours, and thereby Binder 3-1, which is a cardo-based binder resin in which a silane group as in Compound 2-4 is substituted, was obtained.

Synthesis Examples 2-31 to 2-36

(Synthesis of Binders 3-2 to 3-7)

Cardo-based binder resins, Binders 3-2 to 3-7, in which the silane group is substituted, were prepared in the same manner as in Synthesis Example 2-30, except that Polymers 1-2 to 1-7 shown in Table 4 below were used instead of the solution of Polymer 1-1 in Synthesis Example 2-30.

TABLE 4

| | Synthesis Example 2-30 (Binder 3-1) | Synthesis Example 2-31 (Binder 3-2) | Synthesis Example 2-32 (Binder 3-3) | Synthesis Example 2-33 (Binder 3-4) | Synthesis Example 2-34 (Binder 3-5) | Synthesis Example 2-35 (Binder 3-6 | Synthesis Example 2-36 (Binder 3-7) |
|---|---|---|---|---|---|---|---|
| Polymer Backbone | Polymer 1-1 | Polymer 1-2 | Polymer 1-3 | Polymer 1-4 | Polymer 1-5 | Polymer 1-6 | Polymer 1-7 |
| Silane Group | Compound 2-4 | Compound 2-4 | Compound 2-4 | Compound 2-4 | Compound 2-4 | Compound 2-4 | Compound 2-4 |
| Solid Content | 34% | 34% | 34% | 34% | 34% | 34% | 34% |
| Weight Average Molecular Weight | 4,900 g/mol | 4,290 g/mol | 4,690 g/mol | 4,480 g/mol | 4,180 g/mol | 5,290 g/mol | 3,380 g/mol |

Synthesis Example 3 (Synthesis of Acryl Binder)

Into a 250 mL three-neck round bottom flask equipped with a distillation tube, 55 g of propylene glycol methyether acetate (Sigma Aldrich), 31.5 g (0.18 mol) of benzyl methacrylate (Sigma Aldrich), 2.25 g (0.01 mol) of azobisisobutyronitrile (Sigma Aldrich), 6.75 g (0.07 mol) of methyl methacrylate (Sigma Aldrich), and 6.75 g (0.08 mol) of methacrylic acid (Sigma Aldrich) were added, and the mixture was stirred at 80° C. for 3 hours, a propylene glycol methyether acetate solution containing 30 wt % solids of acrylic binder with a weight average molecular weight of 10,000 was obtained.

Preparation Example 1

(Preparation of Red Pigment Dispersion)

15 g of Irgaphor Red BT-CF (red pigment/BASF), 8.5 g of Disperbyk 163 (BYK), and 6.5 g of SR-6100 (SMS), 70 g of propylene glycol methyl ether acetate, and 100 g of zirconia beads with a diameter of 0.5 mm (Toray) were dispersed using a paint shaker (Asada Company) for 10 hours to obtain a dispersion.

Preparation Examples 2-1 to 2-10 (Preparation of Composition of Present Disclosure)

Compositions 1-1 to 1-10 including the reactive silica of the present disclosure and the alkali-soluble resin of the present disclosure were prepared according to the compositions (wt %) shown in Table 5 below.

In the case of Preparation Example 3-1, Compositions were prepared with the same compositions as in Preparation Example 2-1, except that Binder 1-6 was used instead of Binder 1-1.

In the case of Preparation Example 3-2, Compositions were prepared with the same compositions as in Preparation Example 2-2, except that Binder 1-7 was used instead of Binder 2-3.

In the case of Preparation Example 3-3, Compositions were prepared with the same compositions as in Preparation Example 2-1, except that Acryl Binder was used instead of Binder 1-1.

In the case of Preparation Example 3-4, Compositions were prepared with the same compositions as in Preparation Example 2-3, except that Binder 1-6 was used instead of Binder 1-1.

TABLE 5

| | Preparation Example 2-1 (Composition 1-1) | Preparation Example 2-2 (Composition 1-2) | Preparation Example 2-3 (Composition 1-3) | Preparation Example 2-4 (Composition 1-4) | Preparation Example 2-5 (Composition 1-5) | Preparation Example 2-6 (Composition 1-6) | Preparation Example 2-7 (Composition 1-7) | Preparation Example 2-8 (Composition 1-8) | Preparation Example 2-9 (Composition 1-9) | Preparation Example 2-10 (Composition 1-10) |
|---|---|---|---|---|---|---|---|---|---|---|
| Red Pigment Dispersion | 30 | 30 | — | — | — | — | — | — | — | — |
| Reactive Silica Particle 1 | 3 | — | 3 | — | — | — | — | 3 | 3 | — |
| Reactive Silica Particle 2 | — | 3 | — | 3 | — | — | — | — | — | — |
| Reactive Silica Particle 3 | — | — | — | — | 3 | — | — | — | — | — |
| Reactive Silica Particle 4 | — | — | — | — | — | 3 | — | — | — | — |
| Reactive Silica Particle 5 | — | — | — | — | — | — | 3 | — | — | — |
| Reactive Silica Particle 6 | — | — | — | — | — | — | — | — | — | 3 |
| M600 (Miwon Specialty Chemical) | 7 | 7 | 7 | 7 | 7 | 7 | 7 | 7 | 7 | 7 |
| OXE-02 (BASF) | 0.5 | 0.5 | 0.5 | 0.5 | 0.5 | 0.5 | 0.5 | 0.5 | 0.5 | 0.5 |
| Binder 1-1 | 8 | — | 8 | 8 | 8 | 8 | 8 | — | — | 8 |
| Binder 2-3 | — | 8 | — | — | — | — | — | 8 | — | — |
| Binder 3-2 | — | — | — | — | — | — | — | — | 8 | — |
| Propylene Glycol Methyl Ether Acetate (Daicel Corp.) | 51.5 | 51.5 | 81.5 | 81.5 | 81.5 | 81.5 | 81.5 | 81.5 | 81.5 | 81.5 |

Preparation Examples 3-1 to 3-8 (Preparation of Comparative Compositions)

Compositions 2-1 to 2-8, which do not include the reactive silica of the present disclosure or the alkali-soluble resin of the present disclosure, were prepared according to the compositions (wt %) shown in Table 6 below.

In the case of Preparation Example 3-5, Compositions were prepared with the same compositions as in Preparation Example 2-4, except that Binder 1-6 was used instead of Binder 1-1.

In the case of Preparation Example 3-6, Compositions were prepared with the same compositions as in Preparation Example 2-5, except that Binder 2-7 was used instead of Binder 1-1.

In the case of Preparation Example 3-7, Compositions were prepared with the same compositions as in Preparation Example 2-8, except that Non-Reactive Silica Particle 1 was used instead of Reactive Silica Particle 1.

In the case of Preparation Example 3-8. Compositions were prepared with the same composition as in Preparation Example 2-3, except that Acryl Binder was used instead of Binder 1-1.

Examples (Evaluation of Resolution, Outgas, and Chemical Resistance of Patterns)

The resolution, amount of outgas, and chemical resistance of the patterns of the compositions in Tables 5 and 6 prepared through the photolithography step were evaluated in the following manner.

TABLE 6

| | Preparation Example 3-1 (Composition 2-1) | Preparation Example 3-2 (Composition 2-2) | Preparation Example 3-3 (Composition 2-3) | Preparation Example 3-4 (Composition 2-4) | Preparation Example 3-5 (Composition 2-5) | Preparation Example 3-6 (Composition 2-6) | Preparation Example 3-7 (Composition 2-7) | Preparation Example 3-8 (Composition 2-8) |
|---|---|---|---|---|---|---|---|---|
| Red Pigment Dispersion | 30 | 30 | 30 | — | — | — | — | — |
| Reactive Silica Particle 1 | 3 | — | 3 | 3 | — | — | — | 3 |
| Reactive Silica Particle 2 | — | 3 | — | — | 3 | — | — | — |
| Reactive Silica Particle 3 | — | — | — | — | — | 3 | — | — |
| Non-Reactive Silica Particle 1 | — | — | — | — | — | — | 3 | — |
| M600 (Miwon Specialty Chemical) | 7 | 7 | 7 | 7 | 7 | 7 | 7 | 7 |
| OXE-02 (BASF) | 0.5 | 0.5 | 0.5 | 0.5 | 0.5 | 0.5 | 0.5 | 0.5 |
| Binder 2-3 | — | — | — | — | — | — | 8 | — |
| Binder 1-6 | 8 | — | — | 8 | 8 | — | — | — |
| Binder 2-7 | — | 8 | — | — | — | 8 | — | — |
| Acryl Binder | — | — | 8 | — | — | — | — | 8 |
| Propylene Glycol Methyl Ether Acetate (Daicel Corp.) | 51.5 | 51.5 | 51.5 | 81.5 | 81.5 | 81.5 | 81.5 | 81.5 |

The method of preparing patterns using the compositions in Tables 5 and 6 is as follows (photolithography step).

(1) Application and Film Forming Steps

Each of the compositions in Tables 5 and 6 above was applied to a washed 5 cm*5 cm stainless steel substrate to a thickness of 3 μm using a spin coater, and then heated at 100° C. for 1 minute to remove the solvent to form a coating film.

(2) Exposure to Light Step

In order to form the necessary pattern on the obtained coating film, an open mask of a predetermined shape was used, and then active rays in the range of 190 nm to 500 nm were irradiated. The exposure machine used was MA-6, and the exposure dose was 100 mJ/$cm^2$.

(3) Developing Step

Following the exposure to light step, the resultant was developed by dipping it in AX 300 MIF developer (AZEM) at 25° C. for 1 minute, and then washed with water.

(4) Post-Treatment Step

The film obtained by the development was post-baked in an oven at 100° C. for 60 minutes, and then the patterns formed with the compositions in Tables 5 and 6 were obtained.

Example 1

The resolution of the pattern formed with Composition 1-1 and the chemistry within the amount of outgas generation were evaluated in the following manner, and the results are shown in Table 7 below.

1. Evaluation of Resolution (Measurement of Minimum Pattern Size on Substrate)

The size of a minimum pattern on the substrate was measured for the pattern of Composition 1-1 obtained through the photolithography step using an optical microscope (Nikon).

Evaluation of Outgas (Measurement of Amount of Outgas Generation)

A pattern of Composition 1-1 was formed on a glass substrate through the photolithography step. The glass substrate on which a pattern was formed was cut to a size of 1 cm×3 cm to produce a total of 6 specimens. The outgas from the specimens were collected at 250° C. for 30 minutes using JTD-505III (JAI).

3. Evaluation of Chemical Resistance (Measurement of Changes in Thickness Before and After Immersion into Solvent)

The thickness of the pattern of Composition 1-1 obtained through the photolithography step was measured, and after placing it in propylene glycol methyl ether acetate at a temperature of 50° C. for 5 minutes, the thickness of the pattern was measured, and the change in thickness was observed to measure chemical resistance.

Examples 2 to 10

Patterns were formed in the same manner as Example 1, using Compositions 1-2 to 1-10 instead of Composition 1-1. The resolution, amount of outgas generation, and chemical resistance of the formed patterns were evaluated in the same manner as in Example 1, and the results are shown in Table 7 below.

Comparative Examples 1 to 8

Patterns were formed in the same manner as Example 1, using Compositions 2-1 to 2-8 instead of Composition 1-1 in Example 1. The resolution, amount of outgas generation, and chemical resistance of the formed patterns were evaluated in the same manner as in Example 1, and the results are shown in Table 7 below.

TABLE 7

| | Pattern Composition | Minimum pattern size on substrate (μm) | amount of outgas generation (ppm) | Thickness of pattern before immersion into solvent (μm) | Thickness of pattern after immersion into solvent (μm) (propylene glycol methyl ether acetate, 50° C., 5 min) | Change in Thickness of Pattern before and after immersion into solvent (μm) |
|---|---|---|---|---|---|---|
| Example 1 | Composition 1-1 | 4.5 | 4.5 | 2.53 | 2.41 | 0.12 |
| Example 2 | Composition 1-2 | 4.3 | 4.4 | 2.54 | 2.38 | 0.16 |
| Example 3 | Composition 1-3 | 3.5 | 3.0 | 2.53 | 2.45 | 0.08 |
| Example 4 | Composition 1-4 | 3.8 | 2.6 | 2.53 | 2.44 | 0.09 |
| Example 5 | Composition 1-5 | 4.1 | 2.2 | 2.54 | 2.49 | 0.05 |
| Example 6 | Composition 1-6 | 3.9 | 2.4 | 2.52 | 2.48 | 0.04 |
| Example 7 | Composition 1-7 | 3.7 | 2.5 | 2.49 | 2.42 | 0.07 |
| Example 8 | Composition 1-8 | 3.6 | 3.3 | 2.51 | 2.42 | 0.09 |
| Example 9 | Composition 1-9 | 3.4 | 2.8 | 2.53 | 2.45 | 0.08 |
| Example 10 | Composition 1-10 | 9.8 | 4.5 | 2.51 | 2.46 | 0.05 |
| Comparative Example 1 | Composition 2-1 | 8.7 | 9.2 | 2.54 | 2.2 | 0.34 |
| Comparative Example 2 | Composition 2-2 | 8.3 | 10.8 | 2.52 | 2.14 | 0.38 |
| Comparative Example 3 | Composition 2-3 | 13.2 | 17.3 | 2.53 | 1.37 | 1.16 |
| Comparative Example 4 | Composition 2-4 | 6.7 | 8.2 | 2.51 | 2.23 | 0.28 |
| Comparative Example 5 | Composition 2-5 | 6.5 | 7.8 | 2.50 | 2.23 | 0.27 |
| Comparative Example 6 | Composition 2-6 | 7.3 | 5.5 | 2.52 | 2.27 | 0.25 |
| Comparative Example 7 | Composition 2-7 | 11.3 | 4.8 | 2.53 | 1.3 | 1.23 |
| Comparative Example 8 | Composition 2-8 | 12.6 | 13.3 | 2.52 | 1.47 | 1.05 |

In Table 7 above, upon comparison of Example 1 and Comparative Example 1; Example 2 and Comparative Example 2; Example 3, Example 8, and Example 9 and Comparative Example 4; Example 4 and Comparative Example 5; Comparing Example 5 and Comparative Example 6, it can be seen that among the components of the compositions forming the patterns, only the binder resin was used differently. In the cases of Binder 1-6 or Binder 2-7 used in Comparative Examples 1, 2, and 4 to 6, the polymer backbone is formed by polymerizing one type of monomers, and depending on the structure of the monomer, it has a relatively linear form compared to Binders 1-1, 2-3, and 3-2.

In contrast, in the cases of Binders 1-1, 2-3, and 3-2 used in Examples 1 to 5, 8, and 9, the resultants are polymerized with three types of monomers with different structures and have a relatively network-like structure compared to Binders 1-6 and 2-7. Therefore, it is determined that Binders 1-1, 2-3, and 3-2 are more suitable for the photolithography process by effectively forming intermolecular bonds with surrounding compounds due to their structural characteristics, and thus, Examples 1 to 9 showed higher pattern resolution than Comparative Examples 1, 2, 4, 5, and 6, and have a lesser amount of outgas generation and excellent chemical resistance.

In Table 7 above, upon comparison of Comparative Example 7, in which non-reactive silica was used, and Example 8, in which the reactive silica of the present disclosure was used, it can be seen that both Comparative Example 7 and Example 8 used Binder 2-3, which is the alkali-soluble resin of the present disclosure, and it can be confirmed that Example 8, which includes both reactive silica and alkali-soluble resin, was superior to Comparative Example 7 in terms of characteristics of resolution, the amount of outgas generation, and chemical resistance.

Meanwhile, in the case of Comparative Example 3, in which reactive silica and acrylic binder of the present disclosure was used, the resolution was much lower and the amount of outgas generation was higher compared to those of Comparative Example 1, in which the same reactive silica and cardo-based binder were used, and it was confirmed that the amount of thickness reduction was also larger when chemical resistance was measured.

In particular, when comparing Example 1, in which the alkali-soluble resin of the present disclosure was used, with Comparative Example 3, it was found that there were clear differences in terms of characteristics of resolution, the amount of outgas generation, and chemical resistance. Compared to Comparative Example 3 above, even in the case of Comparative Example 8, in which a pigment dispersion was not included, it was confirmed that resolution and chemical resistance were significantly reduced, and the amount of outgas generation was also larger compared to Comparative Example 4, Example 3, Example 8, and Example 9.

Meanwhile, in Table 7, upon comparison of Example 1, in which an acrylic group was substituted on the surface and reactive silica 1 with a particle diameter of 54 nm was used, Example 10, in which an acrylic group was substituted on the surface and reactive silica 6 with a particle diameter of 520 nm was used, it was confirmed that even when reactive silica with the same reactive functional group was used, the resolution could be affected by the size of the reactive silica particles.

Additionally, upon comparison of Example 1 and Example 10, when the particle size of the reactive silica particles was 520 nm or more as in Example 10, it was confirmed that the resolution characteristic was significantly reduced; however, upon comparison of Example 10 and Comparative Examples 1 to 8, it was confirmed that Example 10, in which both the reactive silica and the alkali-soluble resin of the present disclosure were included, the amount of outgas generation was lower and chemical resistance was superior.

Summarizing the evaluation results above, in Table 7 above, upon comparison of Examples 1 to 10, in which the compositions including the reactive silica of the present disclosure and the alkali-soluble resin of the present disclosure were evaluated, and Comparative Examples 1 to 8, in which the compositions including silica or resins different from the reactive silica and alkali-soluble resin of the present disclosure were evaluated, it can be seen that Examples 1 to 10, in which sufficient curing occurred during the exposure process or post-treatment process conducted at 100° C. or lower, resulting in excellent resolution due to the small minimum pattern size on the substrate, the amount of outgas generation was less, and chemical resistance was superior. This appears to be because when the reactive silica and alkali-soluble resin of the present disclosure are used together, unpredictable effects occur due to the structural characteristics of the two materials.

The present disclosure is not limited to the embodiments above and the compositions can be prepared in various different forms.

The above description is merely illustrative of the present disclosure, and those skilled in the art will be able to make various modifications without departing from the essential characteristics of the present disclosure.

Accordingly, the embodiments disclosed herein are illustrative and not intended to limit the invention, and the spirit and scope of the present disclosure are not limited by these embodiments. The protection scope of the present disclosure should be construed according to the claims, and all techniques within the equivalent range should be construed as being included in the scope of the present disclosure.

Industrial Applicability

The present disclosure relates to a photosensitive composition and a display device manufactured using the same.

What is claimed is:

1. A photosensitive composition comprising alkali soluble resin; a reactive unsaturated compound; a photoinitiator; a solvent; and a reactive silica particle having a structure represented by the following Formula (1):

Formula (1)

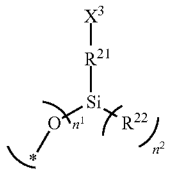

wherein

1) $R^{21}$ is a single bond, a fluorenylene group, a $C_{1-30}$ alkylene group, a $C_{6-30}$ arylene, a $C_{2-30}$ heterocycle group, or a $C_{1-30}$ alkoxylene group, 2) $R^{22}$ is a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 3) $n^1$ is an integer of 0 to 4; $n^2$ is an integer of 0 to 2; and $n^1+n^2=3$, 4) * is a part being connected to a silica particle, 5) $X^3$ is one of the following Formulas a) to e):

(a)

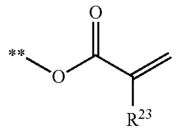

(b)

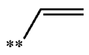

(c)

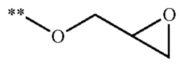

(d)

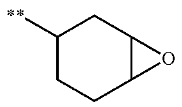

(e)

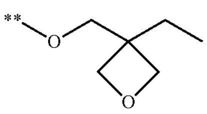

6) ** is a part being connected to Si or $R^{21}$,

7) $R^{23}$ is hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, and 8) the $R^{21}$ to $R^{23}$ and $X^3$ may each be further substituted with one or more substituents selected from the group consisting of deuterium; a halogen; a silane group substituted or unsubstituted with a $C_{1-30}$ alkyl group or $C_{6-30}$ aryl group; a siloxane group; a boron group; a germanium group; a cyano group; an amino group; a nitro group; a $C_{1-30}$ alkylthio group; a $C_{1-30}$ alkoxy group; a $C_{6-30}$ arylalkoxy group; a $C_{1-30}$ alkyl group; a $C_{2-30}$ alkenyl group; a $C_{2-30}$ alkynyl group; a $C_{6-30}$ aryl group; a $C_{6-30}$ aryl group substituted with deuterium; a fluorenyl group; a $C_{2-30}$ heterocyclic group comprising at least one heteroatom among O, N, S, Si, and P; a $C_{3-30}$ alicyclic group; a $C_{7-30}$ arylalkyl group; a $C_{8-30}$ arylalkenyl group; and a combination thereof; or may form a ring with a neighboring substituent(s).

2. The photosensitive composition of claim 1, wherein the reactive silica particle has an average particle diameter of 1 nm to 300 nm.

3. The photosensitive composition of claim 1, wherein the reactive silica particles are contained in an amount of 0.1 wt % to 20 wt % based on the solid content excluding the solvent.

4. The photosensitive composition of claim 1, wherein the photosensitive composition further comprises a colorant.

5. The photosensitive composition of claim 4, wherein the colorant comprises one or more among inorganic dyes, organic dyes, inorganic pigments, and organic pigments.

6. The photosensitive composition of claim 4, wherein the colorant expresses one color selected from red, green, blue, yellow, and black.

7. The photosensitive composition of claim 4, wherein the colorant is contained in an amount of 5 wt % to 40 wt % based on the total amount of the photosensitive composition.

8. The photosensitive composition of claim 1, wherein the alkali soluble resin comprises a repeat structure of Formula (2):

Formula (2)

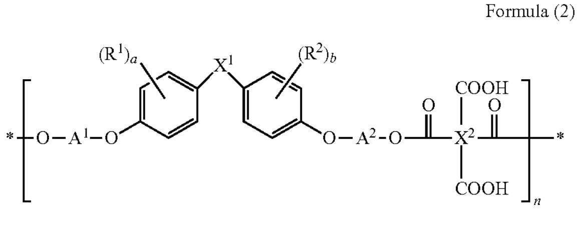

wherein

1) * represents a part where the bindings are connected as a repeat unit, 2) n is an integer of 2 to 200,000, 3) $R^1$ and $R^2$ are each independently hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 4) $R^1$ and $R^2$ each may form a ring with a neighboring group(s), 5) a and b are each independently an integer of 0 to 4, 6) $X^1$ is a single bond; O; CO; $SO_2$; CR'R''; SiR'R''; Formula (A) below; or Formula (B) below, 6-1) R' and R'' are each independently hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 6-2) R' and R'' may form a ring with a neighboring group(s), Formula (A)

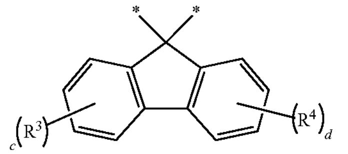

Formula (B)

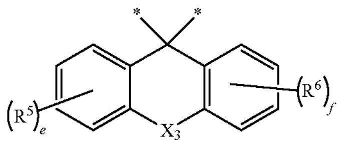

in Formula (A) and Formula (B), 6-3) * represents a bonding position, 6-4) $X^3$ is O, S, $SO_2$, or NR', 6-5) R' is hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 6-6) $R^3$ to $R^6$ are each independently hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 6-7) $R^3$ to $R^6$ each may form a ring with a neighboring group(s), 6-7) c to f are each independently an integer of 0 to 4, 7) $X^2$ is a fluorenyl group; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; or a combination thereof, 8) $A^1$ and $A^2$ are each independently Formula (C) and Formula (D):

Formula (C)

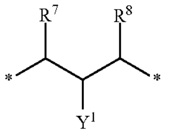

Formula (D)

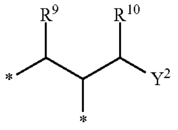

in Formula (C) and Formula (D), 8-1) * represents a bonding position, 8-2) $R^7$ to $R^{10}$ are each independently hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 8-3) $Y^1$ and $Y^2$ are each independently Formula (E) or Formula (F):

Formula (E)

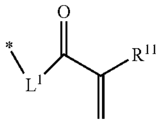

Formula (F)

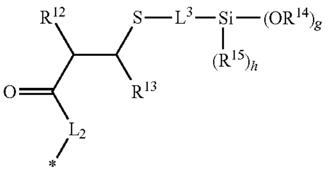

wherein 8-3-1) * represents a binding position, 8-3-2) $R^{11}$ to $R^{15}$ are each independently hydrogen; deuterium; a halogen; a $C_{6-30}$ aryl group; a $C_{2-30}$ heterocyclic group comprising at least one heteroatom among O, N, S, Si, and P; a fused ring group of a $C_{6-30}$ aliphatic ring and a $C_{6-30}$ aromatic ring; a $C_{1-20}$ alkyl group; a $C_{2-20}$ alkenyl group; a $C_{2-20}$ alkynyl group; a $C_{1-20}$ alkoxy group; a $C_{6-30}$ aryloxy group; a fluorenyl group; a carbonyl group; an ether group; or a $C_{1-20}$ alkoxycarbonyl group, 8-3-3) $L^1$ to $L^3$ are each independently a single bond, a fluorenylene group; $C_{1-30}$ alkylene; $C_{6-30}$ arylene; a $C_{2-30}$ heterocyclic ring; or $C_{1-30}$ alkoxylene, 8-3-4) g and h are each independently an integer of 0 to 3, with the proviso that g+h=3, 9) the ratio of Formula (C) or Formula (D) in the resin including a repeating unit represented by Formula (2) above is 1:9 to 9:1, 10) the rings formed by the combination of any of $R^1$ to $R^{15}$, R', R'', $X^2$, and $L^1$ to $L^3$, and a neighboring group(s) thereof may each be further substituted with one or more substituents selected from the group consisting of deuterium; a halogen; a silane group substituted or unsubstituted with a $C_{1-30}$ alkyl group or $C_{6-30}$ aryl group; a siloxane group; a boron group; a germanium group; a cyano group; an amino group; a nitro group; a $C_{1-30}$ alkylthio group; a $C_{1-30}$ alkoxy group; a $C_{6-30}$ arylalkoxy group; a $C_{1-30}$ alkyl group; a $C_{2-30}$ alkenyl group; a $C_{2-30}$ alkynyl group; a $C_{6-30}$ aryl group; a $C_{6-30}$ aryl group substituted with deuterium; a fluorenyl group; a $C_{2-30}$ heterocyclic group including at least one heteroatom among O, N, S, Si, and P; a $C_{3-30}$ alicyclic group; a $C_{7-30}$ arylalkyl group; a $C_{8-30}$ arylalkenyl group; and a combination thereof; or may form a ring between the neighboring substituents.

9. The photosensitive composition of claim 1, wherein the weight average molecular weight of the alkali soluble resin is 1,000 g/mol to 100,000 g/mol.

10. The photosensitive composition of claim 1, wherein the total amount of the alkali soluble resin is 1 wt % to 50 wt % based on the total amount of the photosensitive composition.

11. The photosensitive composition of claim 1, wherein a reactive unsaturated compound is included in an amount of 1 wt % to 50 wt % based on the total amount of the photosensitive composition.

12. The photosensitive composition of claim 1, wherein a photoinitiator is included in an amount of 0.01 wt % to 10 wt % based on the total amount of the photosensitive composition.

13. A pattern or film formed with the photosensitive resin composition according to claim 1.

14. An organic light emitting display device comprising the pattern or film according to claim 13.

15. The organic light emitting display device of claim 14, wherein at least one of a flattening layer, an organic light emitting device layer, a sealing layer, a touch panel, and a color filter comprises the pattern or film.

16. An electronic device comprising the display device of claim 14 and a control unit for operating the display device.

* * * * *